(12) United States Patent
Kim

(10) Patent No.: US 12,272,665 B2
(45) Date of Patent: Apr. 8, 2025

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventor: Yongho Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/378,166

(22) Filed: Oct. 10, 2023

(65) Prior Publication Data

US 2024/0047399 A1     Feb. 8, 2024

Related U.S. Application Data

(62) Division of application No. 17/215,131, filed on Mar. 29, 2021, now Pat. No. 11,798,908.

(30) Foreign Application Priority Data

Aug. 14, 2020    (KR) ........................ 10-2020-0102791

(51) Int. Cl.
     *H01L 23/00*          (2006.01)

(52) U.S. Cl.
     CPC .... *H01L 24/14* (2013.01); *H01L 2224/13118* (2013.01); *H01L 2224/13124* (2013.01);
(Continued)

(58) Field of Classification Search
     CPC ........... H01L 24/14; H01L 2224/13139; H01L 2224/0401; H01L 2224/13147;
(Continued)

(56) References Cited

U.S. PATENT DOCUMENTS 6,840,777 B2    1/2005   Sathe et al.
8,809,123 B2    8/2014   Liu et al.
(Continued)

FOREIGN PATENT DOCUMENTS

KR    10-2017-0129534 A    11/2017

OTHER PUBLICATIONS

Office Action dated Oct. 21, 2024 from the Korean Intellectual Property Office (KIPO) for corresponding Korean Patent Application No. 10-2020-0102791.
(Continued)

*Primary Examiner* — Thanh Y. Tran
(74) *Attorney, Agent, or Firm* — F. CHAU & ASSOCIATES, LLC

(57) ABSTRACT

A semiconductor package includes: a first semiconductor device including a first pad and a first metal bump structure on the first pad; and a second semiconductor device on the first semiconductor device, and including a third pad and a second metal bump structure on the third pad, wherein the first and second metal bump structures are bonded to each other to electrically connect the first and second semiconductor devices to each other. Each of the first and second metal bumps structures includes first to third metal patterns. The first to third metal patterns of the first metal bump structure are on the first pad. The first to third metal patterns of the second metal bump structure are on the third pad. The first and third metal patterns include a first metal having a first coefficient of thermal expansion less than that of a second metal of the second metal pattern.

20 Claims, 21 Drawing Sheets

(52) U.S. Cl.
CPC ............... *H01L 2224/13139* (2013.01); *H01L 2224/13147* (2013.01)

(58) Field of Classification Search
CPC ..... H01L 25/0657; H01L 24/05; H01L 24/29; H01L 24/83; H01L 2224/05147; H01L 2224/05095; H01L 2224/05094
See application file for complete search history.

(56) References Cited

U.S. PATENT DOCUMENTS

| | | | |
|---|---|---|---|
| 9,953,941 | B2 | 4/2018 | Enquist |
| 10,083,939 | B2 | 9/2018 | Seo et al. |
| 10,390,440 | B1 | 8/2019 | Lo et al. |
| 2003/0214029 | A1* | 11/2003 | Tao .................... H01L 23/10 257/E21.705 |
| 2011/0186986 | A1 | 8/2011 | Chuang et al. |
| 2012/0012997 | A1 | 1/2012 | Shen et al. |
| 2013/0270699 | A1 | 10/2013 | Kuo et al. |
| 2013/0292827 | A1 | 11/2013 | Kuo et al. |
| 2014/0299985 | A1* | 10/2014 | Yu .......................... H01L 25/50 257/737 |
| 2016/0013162 | A1 | 1/2016 | Shen et al. |
| 2017/0294394 | A1 | 10/2017 | Suzuki et al. |
| 2020/0051937 | A1 | 2/2020 | Uzoh et al. |
| 2020/0075534 | A1 | 3/2020 | Gao et al. |
| 2020/0126906 | A1 | 4/2020 | Uzoh et al. |
| 2022/0052007 | A1 | 2/2022 | Kim |

OTHER PUBLICATIONS

Laser and Optics User's Manual Chapter 17, 2002, available at https://psec.uchicago.edu/thermal_coefficients/cte_metals_05517-90143.pdf (Year: 2002).

Sn—Ag—Cu Properties and Creep Data, available at https://www.metallurgy.nist.gov/solder/clech/Sn-Ag-Cu_Other/htm (Year: 2008).

* cited by examiner

SEMICONDUCTOR PACKAGE AND METHOD OF MANUFACTURING THE SEMICONDUCTOR PACKAGE

CROSS-REFERENCE TO RELATED APPLICATIONS

This application is a divisional of U.S. patent application Ser. No. 17/215,131 filed on Mar. 29, 2021, which claims priority under 35 U.S.C. § 119 to Korean Patent Application No. 10-2020-0102791, filed on Aug. 14, 2020 in the Korean Intellectual Property Office (KIPO), the disclosures of which are incorporated by reference herein in their entireties.

TECHNICAL FIELD

Exemplary embodiments of the present inventive concept relate to a semiconductor package and a method of manufacturing the semiconductor package. More particularly, exemplary embodiments of the present inventive concept relate to a semiconductor package including semiconductor chips bonded to each other and a method of manufacturing the same.

DISCUSSION OF THE RELATED ART

As a pitch between chip pads decreases, side wetting may occur where solder flows along a side of a UBM pattern. To prevent side wetting, copper to copper bonding (Cu—Cu Bonding) technology is currently under development. However, in a case of copper-copper bonding, since sufficient diffusion at a junction may occur, a relatively high temperature and pressure may be desired, and bonding properties may deteriorate.

SUMMARY

According to an exemplary embodiment of the present inventive concept, a semiconductor package includes: a first semiconductor device including a first pad and a first metal bump structure provided on the first pad; and a second semiconductor device stacked on the first semiconductor device, and including a third pad and a second metal bump structure provided on the third pad, wherein the first and second metal bump structures are bonded to each other to form a conductive connector that electrically connects the first and second semiconductor devices to each other, wherein each of the first and second metal bumps structures includes first, second and third metal patterns, wherein the first, second and third metal patterns of the first metal bump structure are stacked on the first pad, wherein the first, second and third metal patterns of the second metal bump structure are stacked on the third pad, and wherein the first and third metal patterns include a first metal having a first coefficient of thermal expansion, and the second metal pattern includes a second metal having a second coefficient of thermal expansion greater than the first coefficient of thermal expansion.

According to an exemplary embodiment of the present inventive concept, a semiconductor package includes: a first semiconductor device including a first pad and a first metal bump structure provided on the first pad; and a second semiconductor device stacked on the first semiconductor device, and including a third pad and a second metal bump structure provided on the third pad, wherein each of the first and second metal bump structures includes: a main pattern including copper (Cu), wherein the main pattern of the first metal bump structure is provided on the first pad, and the main pattern of the second metal bump structure is provided on the third pad; and a sub pattern provided inside the main pattern adjacent to a junction surface and including a second metal having a coefficient of thermal expansion greater than that of copper (Cu), and wherein the junction surface is formed by the bonding between a first surface of the main pattern of the first metal bump structure and a first surface of the main pattern of the second metal bump structure.

According to an exemplary embodiment of the present inventive concept, a semiconductor package includes: a package substrate; a first semiconductor chip stacked on the package substrate, and including a first pad and a first metal bump structure provided on the first pad; and a second semiconductor chip stacked on the first semiconductor chip, and including a third pad and a second metal bump structure provided on the third pad, wherein the first and second metal bump structures are bonded to each other to form a conductive connector that electrically connects the first and second semiconductor chips to each other, wherein each of the first and second metal bumps structures includes first, second and third metal patterns, wherein the first, second and third metal patterns of the first metal bump structure are stacked on the first pad, wherein the first, second and third metal patterns of the second metal bump structure are stacked on the third pad, wherein the first and third metal patterns includes copper (Cu), and the second metal pattern includes a metal having a coefficient of thermal expansion greater than that of copper (Cu), and wherein diameters of the first and second metal bump structures, respectively, are within a range of about 2 μm to about 15 μm.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be explained in detail with reference to the accompanying drawings.

Figure 1:
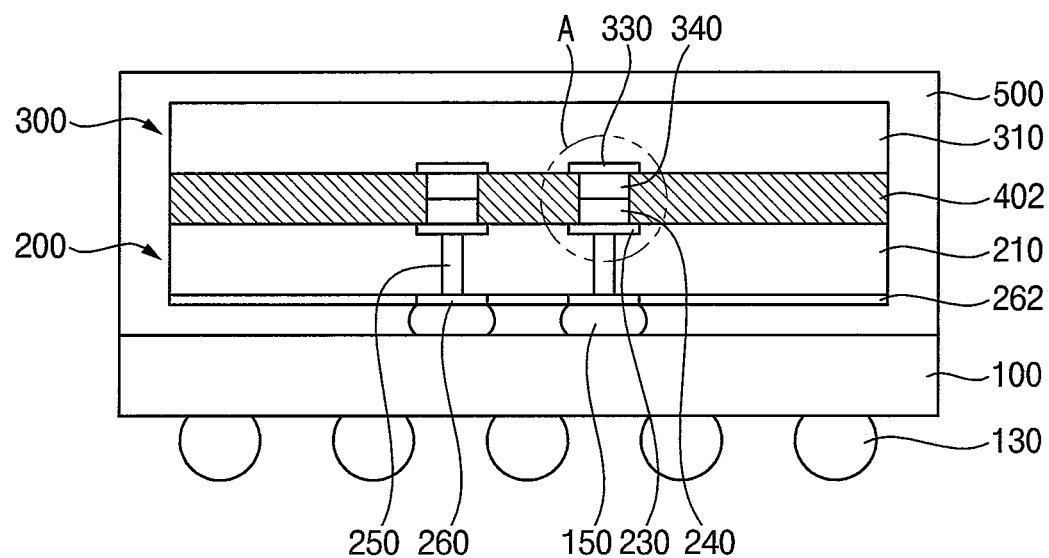
FIG. 1 is a cross-sectional view illustrating a semiconductor package in accordance with an exemplary embodiment of the present inventive concept.
Figure 2:
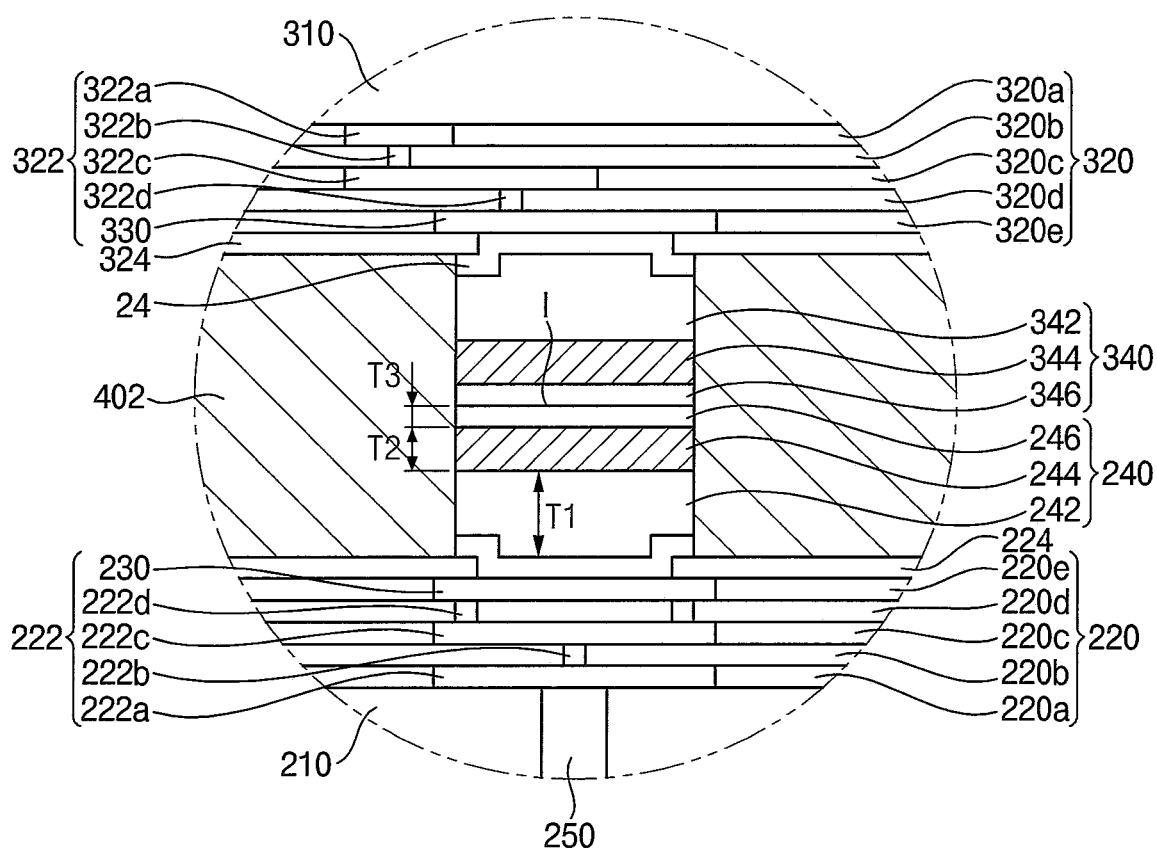
FIG. 2 is an enlarged cross-sectional view illustrating portion 'A' in FIG. 1.

FIG. 1 is a cross-sectional view illustrating a semiconductor package in accordance with an exemplary embodiment of the present inventive concept. FIG. 2 is an enlarged cross-sectional view illustrating portion 'A' in FIG. 1.

Referring to FIGS. 1 and 2, a semiconductor package 10 may include semiconductor chips stacked therein. The semiconductor package 10 may include a package substrate 100, first and second semiconductor chips 200 and 300 sequentially stacked on the package substrate 100, and a conductive connector provided between the first and second semiconductor chips 200 and 300 and configured to electrically connect the first and second semiconductor chips 200 and 300 to each other. Additionally, the semiconductor package 10 may further include conductive bumps 150, outer connection members 130, and a molding member 500. The conductive bumps 150 may electrically connect the package substrate 100 and the first semiconductor chip 200 to each other. The outer connection members 130 may be electrically connected with an external device.

A plurality of the semiconductor chips 200 and 300 may be stacked vertically. In this embodiment, the first and second semiconductor chips 200 and 300 may be substantially the same or similar to each other. Thus, the same or like reference numerals will be used to refer to the same or like elements and repeated descriptions of the same elements may be omitted.

Although the semiconductor package, which is a multi-chip package, is illustrated as including two stacked semiconductor chips 200 and 300, however, the present inventive concept may not be limited thereto. For example, the semiconductor package may include 4, 8, 12, or 16 stacked semiconductor chips.

Each of the first and second semiconductor chips 200 and 300 may include an integrated circuit chip formed by performing semiconductor manufacturing processes. Each of the semiconductor chips may include, for example, a memory chip or a logic chip.

Hereinafter, the first semiconductor chip 200 will be explained in detail.

The first semiconductor chip 200 may include a substrate 210 and a first pad 230 provided on a first surface of the substrate 210. Additionally, the first semiconductor chip 200 may further include an insulation interlayer 220 and a through electrode 250. The insulation interlayer 220 may be provided on the first surface of the substrate 210, and the through electrode 250 may penetrate the substrate 210.

An insulation interlayer 220 may be provided on the first surface, for example, an active surface of the substrate 210. Circuit patterns may be provided in the active surface of the substrate 210. The circuit patterns may include a transistor, a diode, etc. The circuit patterns may constitute circuit elements. Accordingly, the first semiconductor chip 200 may be a semiconductor device including a plurality of the circuit elements therein.

The insulation interlayer 220 may include a plurality of insulation layers 220a, 220b, 220c, 220d, 220e and a wiring 222 in the insulation layers. The wiring 222 may include a first metal wiring 222a, a first contact 222b, a second metal wiring 222c, a second contact 222c, and a third metal wiring 230 respectively provided in the insulation layers 220a, 220b, 220c, 220d, 220e. At least a portion of the third metal wiring 230 may serve as the first pad (e.g., a landing pad).

An insulation layer pattern 224 may be provided on the insulation interlayer 220 to expose at least portions of the first pads 230. For example, the insulation layer pattern 224 may be a passivation layer.

The through electrode 250 may penetrate the substrate 210 in a thickness direction to contact the first metal wiring 222a. Accordingly, the through electrode 250 may be electrically connected to the first pad 230 through the wiring 222 disposed in the insulation interlayer 220.

A liner layer may be provided on an outer surface of the through electrode 250. For example, the liner layer may include silicon oxide or carbon doped silicon oxide. The liner layer may electrically insulate the substrate 110 and the insulation interlayer 220 from the through electrode 250.

An insulation layer 262 may be provided on a second surface, for example, a backside surface of the substrate 110. A second pad 260 may be provided in the insulation layer 262. The insulation layer 262 may include, for example, silicon oxide, carbon doped silicon oxide, silicon carbon nitride (SiCN), etc. Accordingly, the first and second pads 230 and 260 may be electrically connected to each other by the through electrode 250.

In an exemplary embodiment of the present inventive concept, the second semiconductor chip 300 may include a substrate 310 and a third pad 330 provided on a first surface of the substrate 310. Similar to the first semiconductor chip 200, an insulation layer pattern 324 may be provided on an insulation interlayer 320 and may expose at least portions of the third pads 330. For example, the insulation layer pattern 324 may be a passivation layer.

The second semiconductor chip 300 may be stacked on the first semiconductor chip 200 such that the third pad 330 of the second semiconductor chip 300 faces the first pad 230 of the first semiconductor chip 200. A filling support layer pattern 402 may be interposed between the first and second semiconductor chips 200 and 300. For example, the filling support layer pattern 402 may be an adhesive member.

In an exemplary embodiment of the present inventive concept, the conductive connector may include a metal pillar structure interposed between the first and third pads 230 and 330 of the first and second semiconductor chips 200 and 300. The conductive connector may include a first metal bump structure 240, which is provided on the first pad 230 of the first semiconductor chip 200, and a second metal bump structure 340, which is provided on the third pad 330 of the second semiconductor chip 300. The first and second metal bump structures 240 and 340 may be bonded to each other to serve as an electrical connector for electrically connecting the first and second semiconductor chips 200 and 300 to each other. For example, each of the first and second metal bump structures 240 and 340 may have a cuboid shape, a cylindrical shape or a triangular prism shape. The first and second metal bump structures 240 and 340 may be substantially the same as or similar to each other. Thus, the same or like reference numerals will be used to refer to the same or like elements and repeated descriptions of the same elements may be omitted.

As illustrated in FIG. 2, each of the first and second metal bump structure 240 and 340 may include a main pattern respectively provided on the first and third pads 230 and 330. The main pattern may include a first metal. In addition, each of the first and second metal bump structure 240 and 340 may further include a sub pattern provided inside the main pattern adjacent to a junction surface I. For example, the junction surface I may be the bonding between a first surface of the third metal pattern 246 of the first metal bump structure 240 and a first surface of the third metal pattern 346 of the second metal bump structure 340. The sub pattern may include a second metal having a coefficient of thermal expansion greater than the first metal.

For example, the first metal may include copper (Cu). However, the present inventive concept may not be limited thereto, and the first metal may include a material (e.g., gold (Au)) that can be bonded by inter-diffusion of metal performed by a high-temperature annealing process.

The second semiconductor chip 300 may be stacked on the first semiconductor chip 200 such that the third pad 330 faces the first pad 230. Accordingly, the first metal bump structure 240, which is on the first pad 230, and the second metal bump structure 340, which is on the third pad 330, may be in contact with each other. For example, the first and second metal bump structures 240 and 340 may be bonded to each other by a high-temperature annealing process while in contact with each other (e.g., Cu—Cu Bonding).

For example, the first metal bump structure 240 may include first to third metal patterns 242, 244, 246 sequentially stacked on the first pad 230. The first and third metal patterns 242 and 246 may each include the first metal having a first coefficient of thermal expansion. The second metal pattern 244 may include the second metal having a second coefficient of thermal expansion. For example, the first and third metal patterns 242 and 246 may serve as the main pattern, and the second metal pattern 244 may serve as the sub pattern.

For example, the first metal of the first and third metal patterns 242 and 246 may include copper (Cu), and the second metal of the second metal pattern 244 may include zinc (Zn), aluminum (Al), silver (Ag), etc. The coefficient of thermal expansion of copper (Cu) may be about 16.5 μm/m·K. The coefficient of thermal expansion of zinc (Zn) may be about 25.0 μm/m·K. The coefficient of thermal expansion of aluminum (Al) may be about 23.03 μm/m·K. The coefficient of thermal expansion of silver (Ag) may be about 19.2 μm/m·K.

A diameter of the first metal bump structure 240 may be within a range of about 2 μm to about 15 μm. A height of the first metal bump structure 240 may be within a range of about 2 μm to about 30 μm. A pitch P between the first pads 230 and/or between the third pads 330 may be within a range of about 10 μm to about 20 μm.

The first metal pattern 242 may have a first thickness T1. The second metal pattern 244 may have a second thickness T2 smaller than the first thickness T1, and the third metal pattern 246 may have a third thickness T3 smaller than or the same as the second thickness T2. The first thickness T1 may be within a range of about 70% to about 85% of the height (e.g., thickness) of the first metal bump structure 240. The second thickness T2 may be within a range of about 10% to about 20% of the height of the first metal bump structure 240, and the third thickness T3 may be within a range of about 5% to about 10% of the height of the first metal bump structure 240.

In an exemplary embodiment of the present inventive concept, the first metal pattern 242, the second metal pattern 244 and the third metal pattern 246 may have the same thickness as each other.

Similarly, the second metal bump structure 340 may include first to third metal patterns 342, 344, 346 sequentially stacked on the third pad 330.

The third metal patterns 246 and 346 of the first and second metal bump structures 240 and 340, respectively, may be bonded to each other by the high-temperature annealing process while in contact with each other. Since the second metal patterns 244 and 344 disposed on the third metal patterns 246 and 346 include the metal having the coefficient of thermal expansion greater than that of copper, a local load may be applied to the third metal patterns 246 and 346 to induce a sufficient diffusion at the junction I between the first metal bump structure 240 and the second metal bump structure 340 during the high-temperature thermal compression process, thereby providing excellent bonding properties.

In an exemplary embodiment of the present inventive concept, the conductive bump 150 may be interposed between the package substrate 100 and the first semiconductor chip 200. The conductive bump 150 may electrically connect a substrate pad of the package substrate 100 and a second pad 260 of the first semiconductor chip 200 to each other. For example, the conductive bump 150 may have a diameter of about 10 μm to about 100 μm.

The molding member 500 may be provided on the package substrate 100 to cover the first and second semiconductor chips 200 and 300. For example, the molding member 500 may include an epoxy-based, polyimide-based, or acrylic-based material.

The outer connection members 130 may be provided on the outer connection pads on a lower surface of the package substrate 100.

Hereinafter, a method of manufacturing the semiconductor package in FIG. 1 will be explained.

FIGS. 3 to 20 are cross-sectional views illustrating a method of manufacturing a semiconductor package in accordance with an exemplary embodiment of the present inventive concept. FIGS. 4 to 10 are enlarged cross-sectional views illustrating portion 'B' in FIG. 3.

Figure 13:
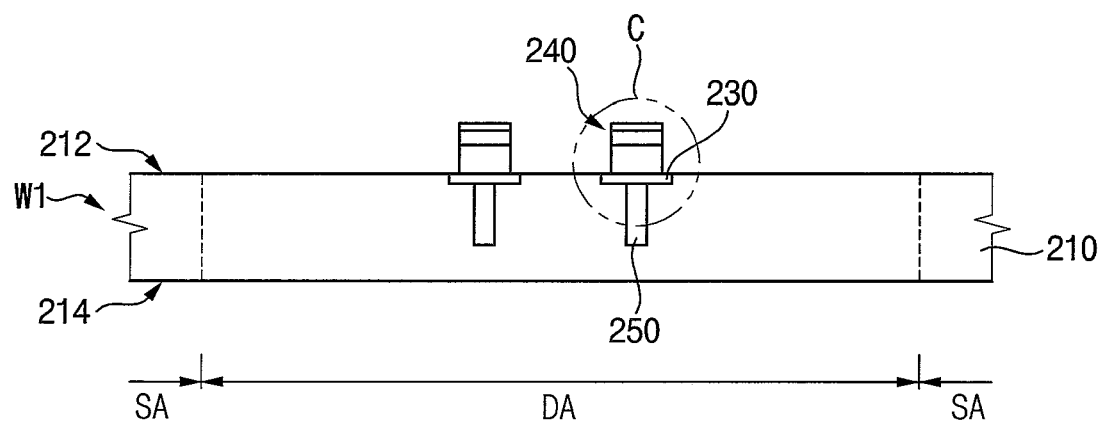
Figure 14:
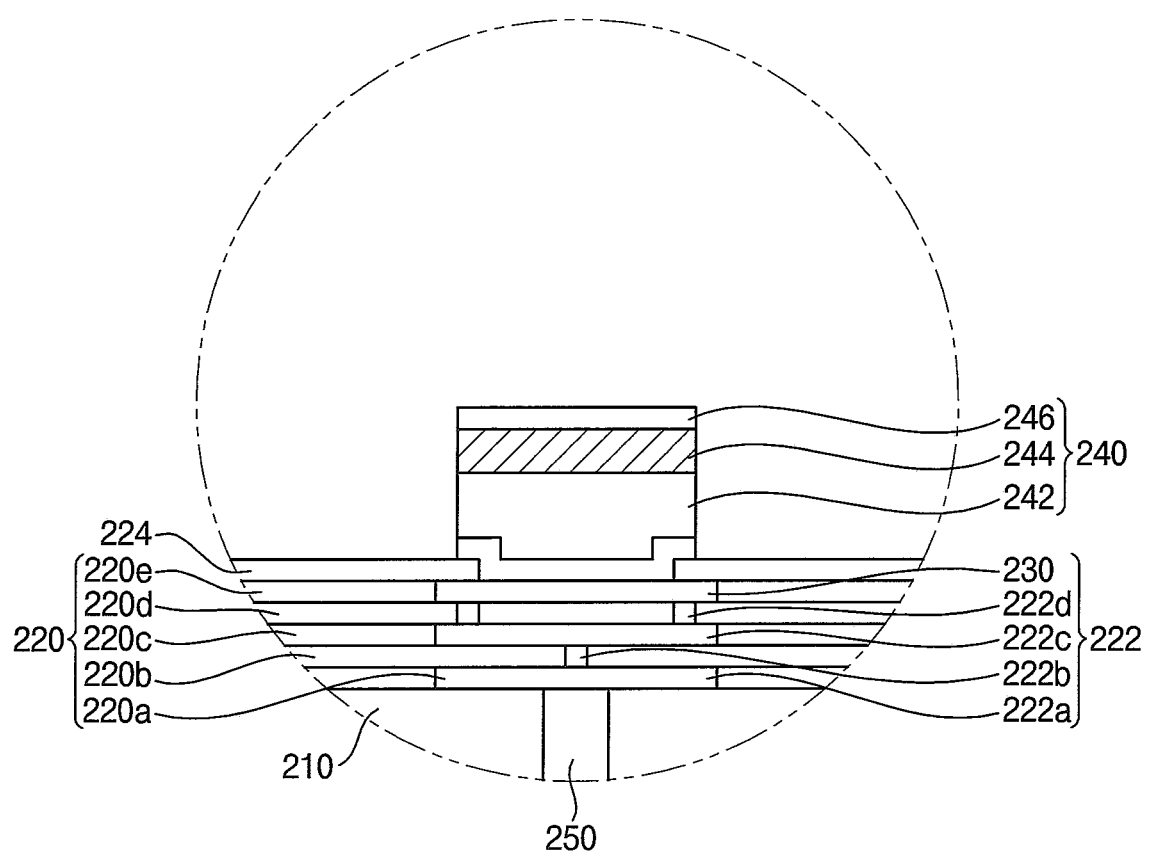

FIG. 14 is an enlarged cross-sectional view illustrating portion 'C' in FIG. 13. FIG. 17 is an enlarged cross-sectional view illustrating portion 'D' in FIG. 16.

Referring to FIGS. 3 to 11, second metal bump structures 340 may be formed on third pads 330 of a second semiconductor chip, respectively.

Figure 3:
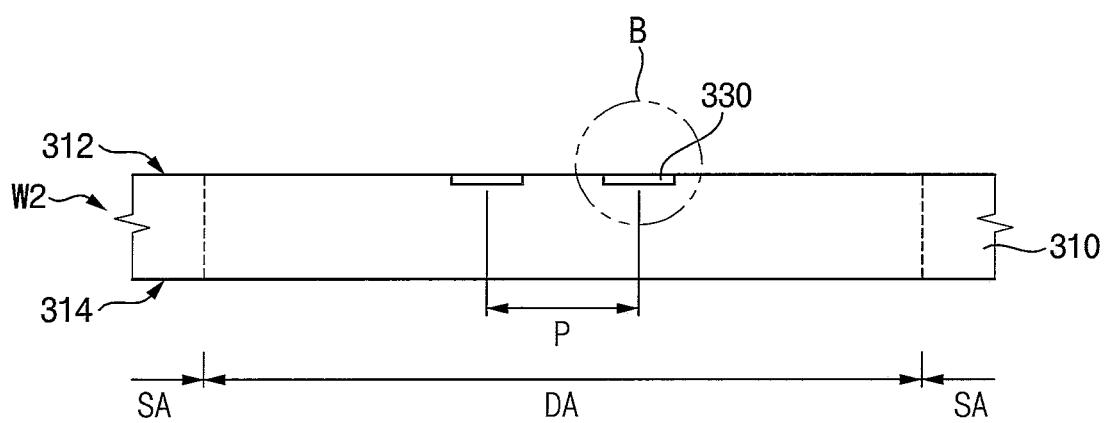
FIGS. 3, 4, 5, 6, 7, 8, 9, 10, 11, 12, 13, 14, 15, 16, 17, 18, 19, and 20 are cross-sectional views illustrating a method of manufacturing a semiconductor package in accordance with an exemplary embodiment of the present inventive concept.

As illustrated in FIG. 3, a second wafer W2 including the second semiconductor chip in a wafer level may be prepared.

In an exemplary embodiment of the present inventive concept, the second wafer W2 may include a substrate 310 and the third pad 330 provided on a first surface 312 of the substrate 310. The substrate 310 may include a die region DA, where circuit patterns and cells are formed, and a scribe lane region SA at least partially surrounding the die region DA. As described later, the substrate 310 may be sawed along the scribe lane region SA dividing the die regions DA to form an individual semiconductor chip.

For example, the substrate 310 may include silicon, germanium, silicon-germanium, or III-V compounds, e.g., GaP, GaAs, GaSb, etc. In an exemplary embodiment of the present inventive concept, the substrate 310 may be a silicon-on-insulator (SOI) substrate, or a germanium-on-insulator (GOI) substrate.

Figure 4:
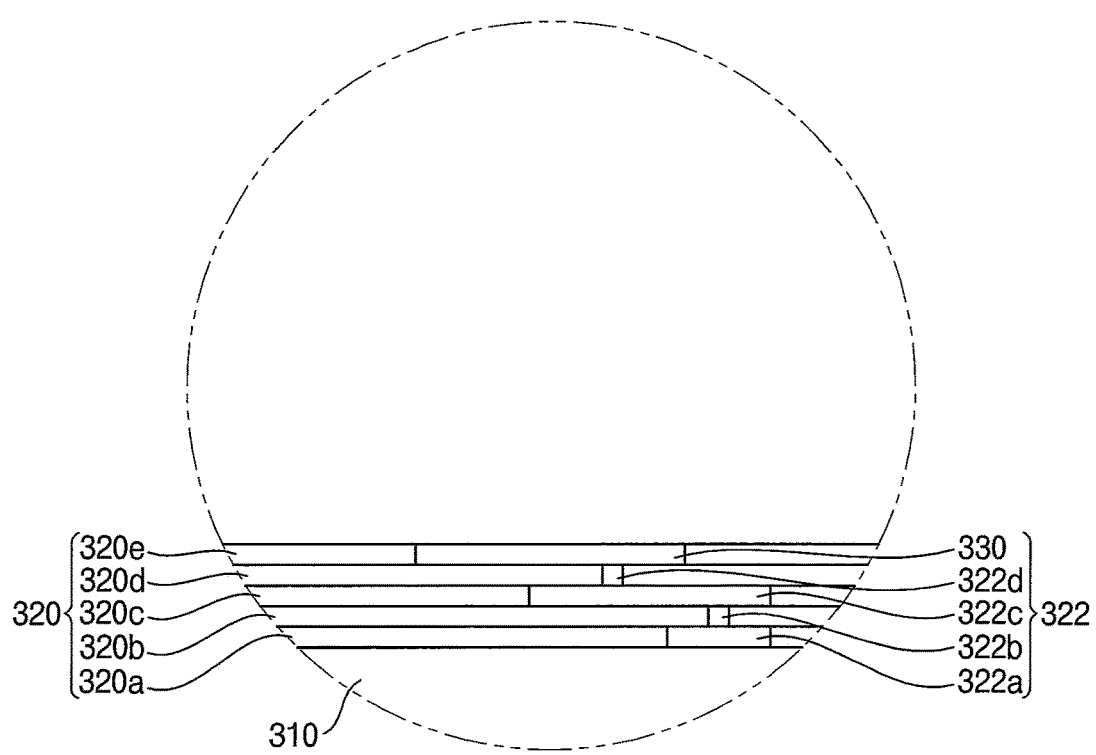

As illustrated in FIG. 4, an insulation interlayer 320 may be provided on the first surface of the substrate 310, for example, an active surface. Circuit patterns may be provided in the active surface of the substrate 310. The circuit patterns may include a transistor, a diode, etc. The circuit patterns may constitute circuit elements.

The insulation interlayer 320 may include a plurality of insulation layers 320a, 320b, 320c, 320d, 320e and a wiring 322 in the insulation layers. The wiring 322 may include a first metal wiring 322a, a first contact 322b, a second metal wiring 322*d* and a third metal wiring 330 respectively provided in the insulation layers 320*a*, 320*b*, 320*c*, 320*d*, 320*e*. At least a portion of the third metal wiring 330 may serve as the third pad, which may be, for example, a landing pad. For example, the third pad 330 may be provided in a front side of the second wafer W2, which is, hereinafter, referred to as the first surface 312 of the substrate 310 for simplicity of explanation.

For example, the third pad 330 may include a metal such as aluminum, copper, etc. A pitch P between the third pads 330 may be within a range of about 10 μm to about 20 μm.

Then, the second metal bump structures 340 may be formed on third pads 330 of the second wafer W2, respectively.

Figure 5:
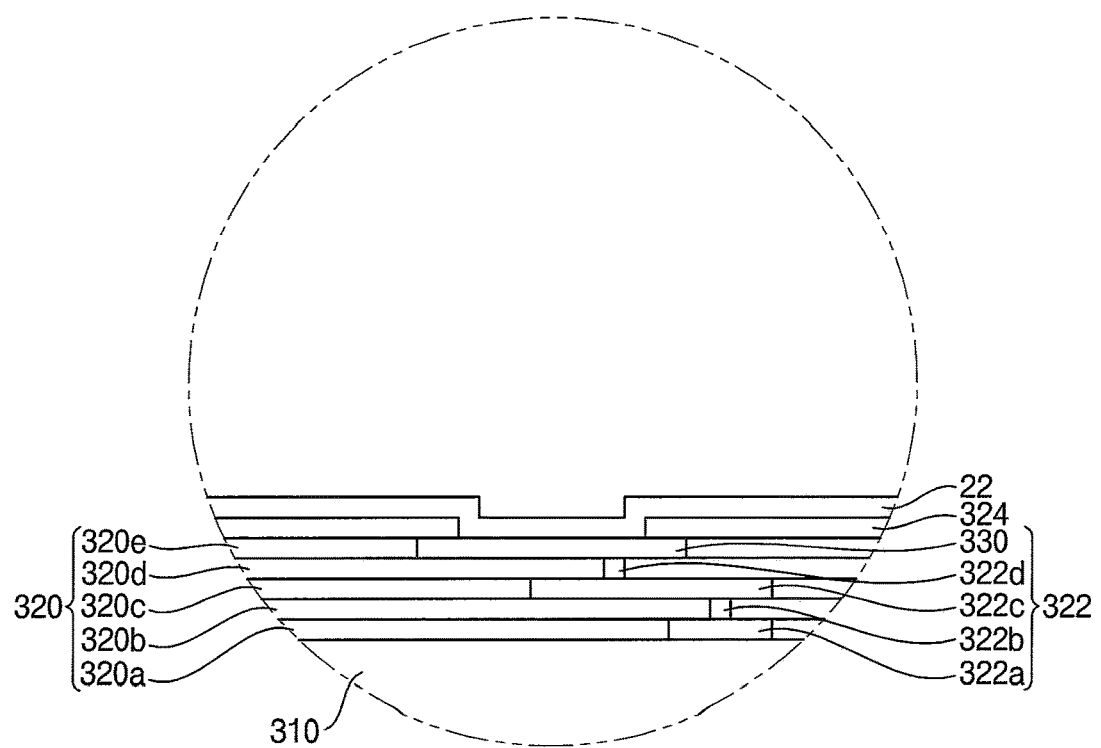

As illustrated in FIG. 5, an insulation layer pattern 324 may be formed on the first surface 312 of the substrate 310 to expose the third pads 330, and then, a seed layer 22 may be formed on the third pads 330.

The insulation layer pattern 324, as a passivation layer, may be formed on the insulation interlayer 320 and may expose at least portions of the third pads 330. For example, the insulation layer pattern 324 may include oxide, nitride, etc. These may be used alone or in a mixture thereof. Additionally, the insulation layer pattern 324 may be formed by, for example, a chemical vapor deposition (CVD) process, a plasma enhanced chemical vapor deposition (PECVD) process, an atomic layer deposition (ALD) process, a lower pressure chemical vapor deposition (LPCVD) process, a sputtering process, etc. In addition, the insulation layer pattern 324 may include a polymer layer formed by a spin coating process or a spray process. In a case that a protective layer pattern for exposing the third pad 330 is formed on the first surface 312 of the substrate 310, the process of forming the insulation layer pattern may be omitted.

For example, the seed layer 22 may include an alloy layer including titanium/copper (Ti/Cu), titanium/palladium (Ti/Pd), titanium/nickel (Ti/Ni), chrome/copper (Cr/Cu) or a combination thereof.

Figure 6:
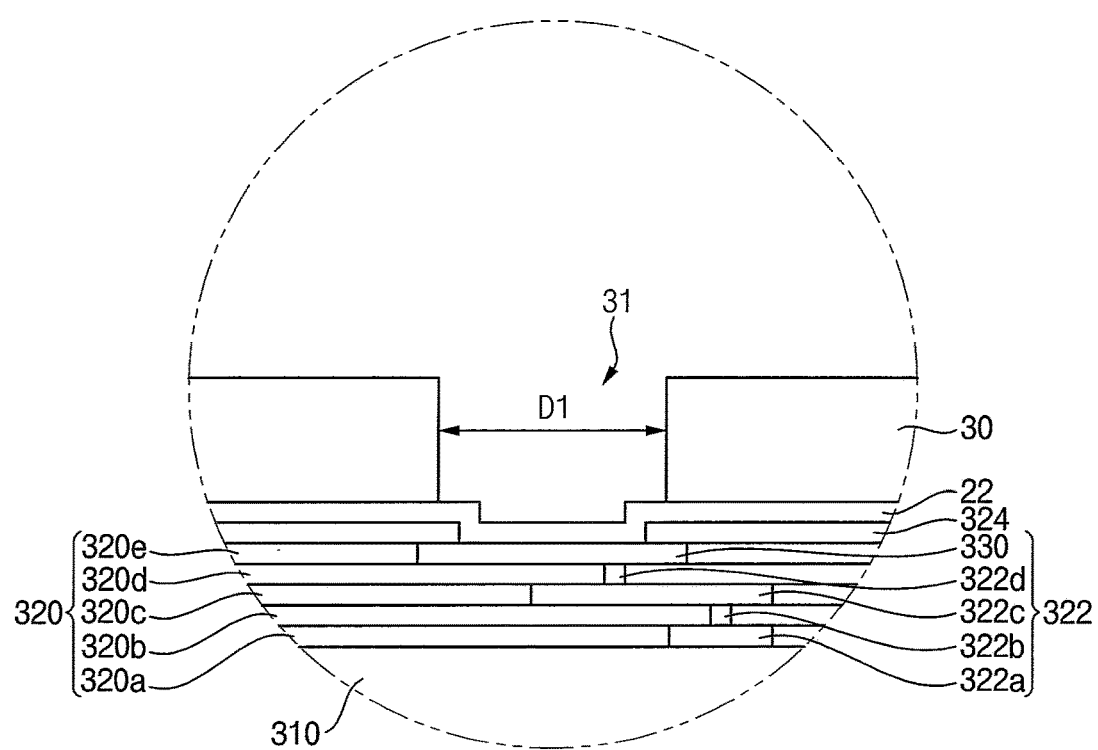

Then, as illustrated in FIG. 6, a photoresist pattern 30 having an opening 31, which exposes a region of the seed layer 22 on the third pad 330, may be formed on the first surface 312 of the substrate 310.

First, a photoresist layer may be formed on the first surface 312 of the substrate 310 to cover the seed layer 22.

For example, a thickness of the photoresist layer may be within a range of about 2 μm to about 40 μm. The thickness of the photoresist layer may be selected in consideration of, for example, a height of the metal bump structure, deformation, process margin, etc.

An exposure process may be performed on the photoresist layer to form the photoresist pattern 30 having the opening 31 which exposes the region of the seed layer 22 on the third pad 330. For example, a diameter D1 of the opening 31 may be within a range of about 2 μm to about 15 μm.

Figure 7:
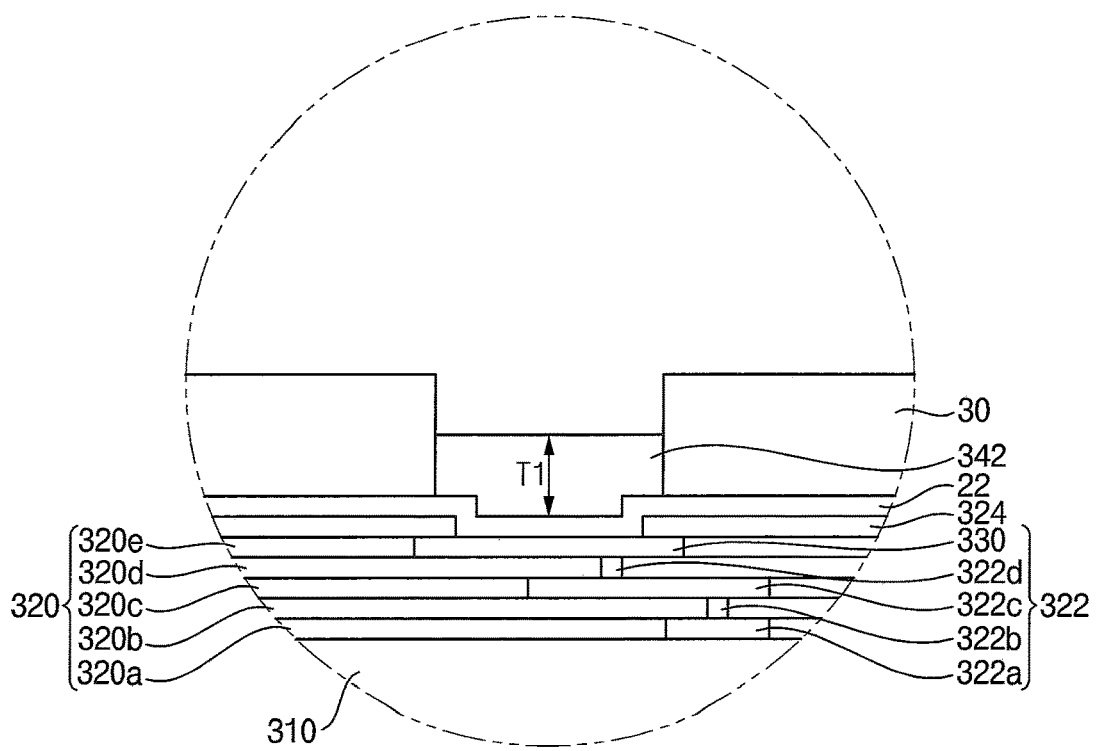

As illustrated in FIG. 7, a first plating process may be performed on the seed layer 22 to form a first metal pattern 342 on the seed layer 22 and including a first metal material.

For example, the first metal material may include copper (Cu). The first metal pattern 342 may have a first coefficient of thermal expansion. The first metal pattern 342 may have a first thickness T1. The coefficient of thermal expansion of copper (Cu) may be about 16.5 μm/m·K.

Figure 8:
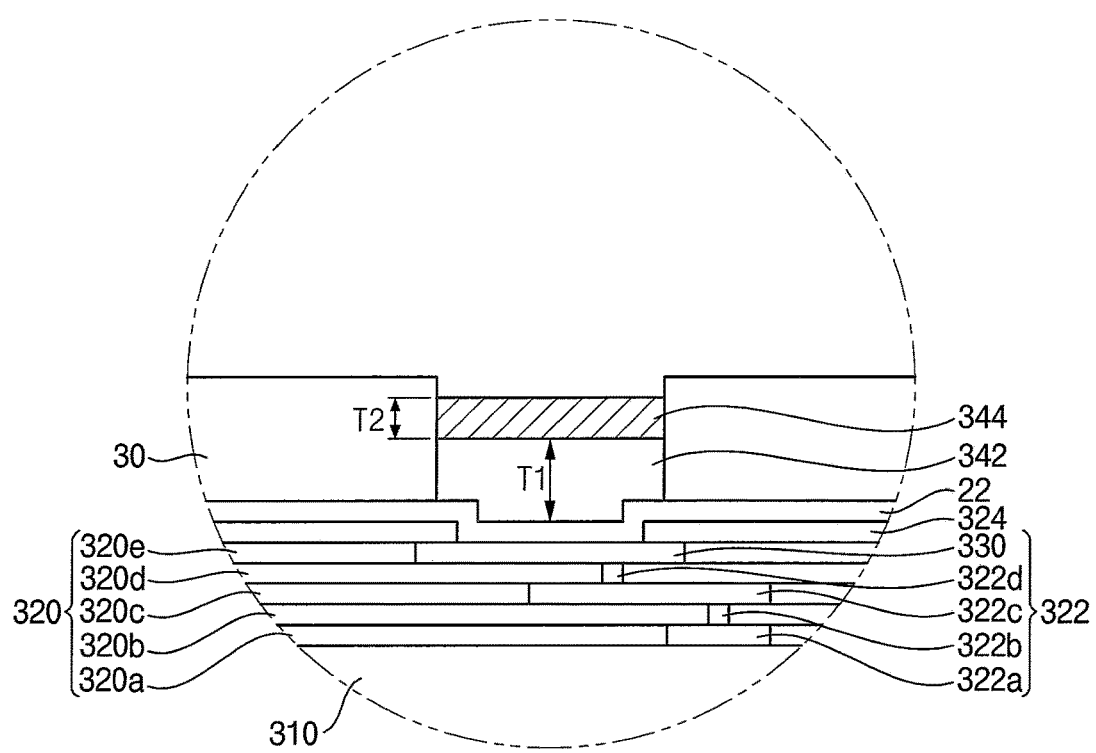

As illustrated in FIG. 8, a second plating process may be performed on the first metal pattern 342 to form a second metal pattern 344 including a second metal material.

For example, the second metal material may include zinc (Zn), aluminum (Al), silver (Ag), etc. The second metal material may have a second coefficient of thermal expansion greater than the first coefficient of thermal expansion of the first metal material. The second metal pattern 344 may have a second thickness T2 smaller than the first thickness T1. The coefficient of thermal expansion of zinc (Zn) may be about 25.0 μm/m·K. The coefficient of thermal expansion of aluminum (Al) may be about 23.03 μm/m·K. The coefficient of thermal expansion of silver (Ag) may be about 19.2 μm/m·K.

Figure 9:
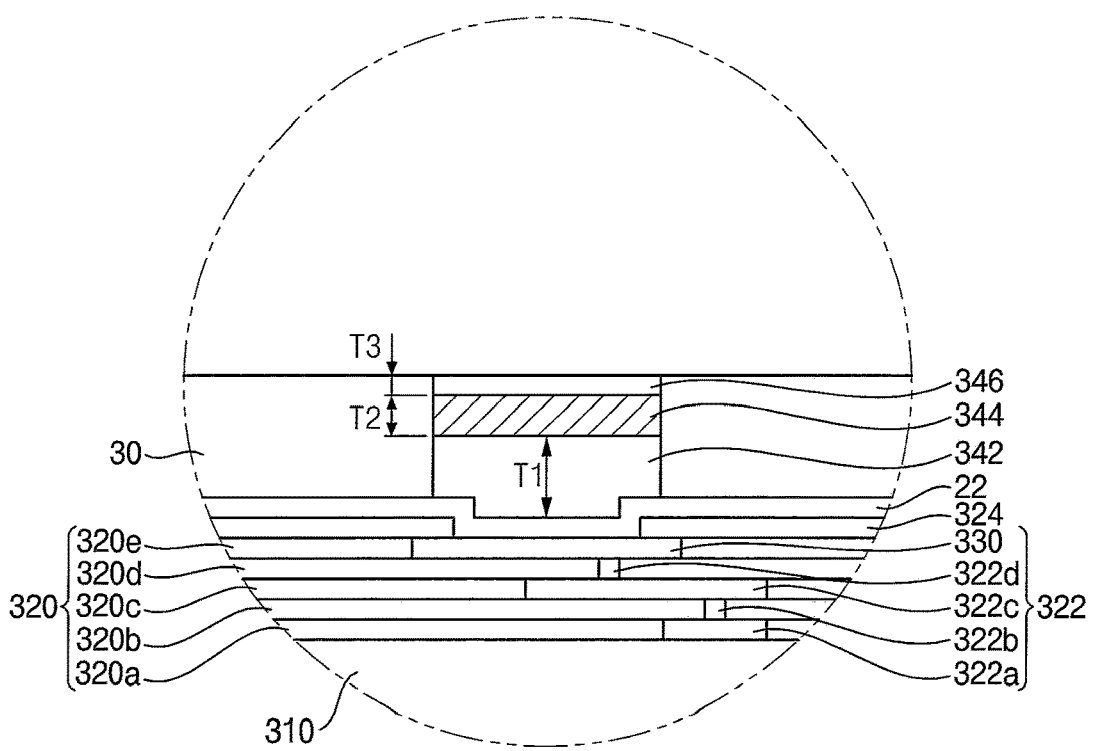

As illustrated in FIG. 9, a third plating process may be performed on the second metal pattern 344 to form a third metal pattern 346 including a third metal material.

For example, the third metal material may include the same metal as the first metal material. The third metal pattern 346 may have a third thickness T3 smaller than the second thickness T2.

Figure 10:
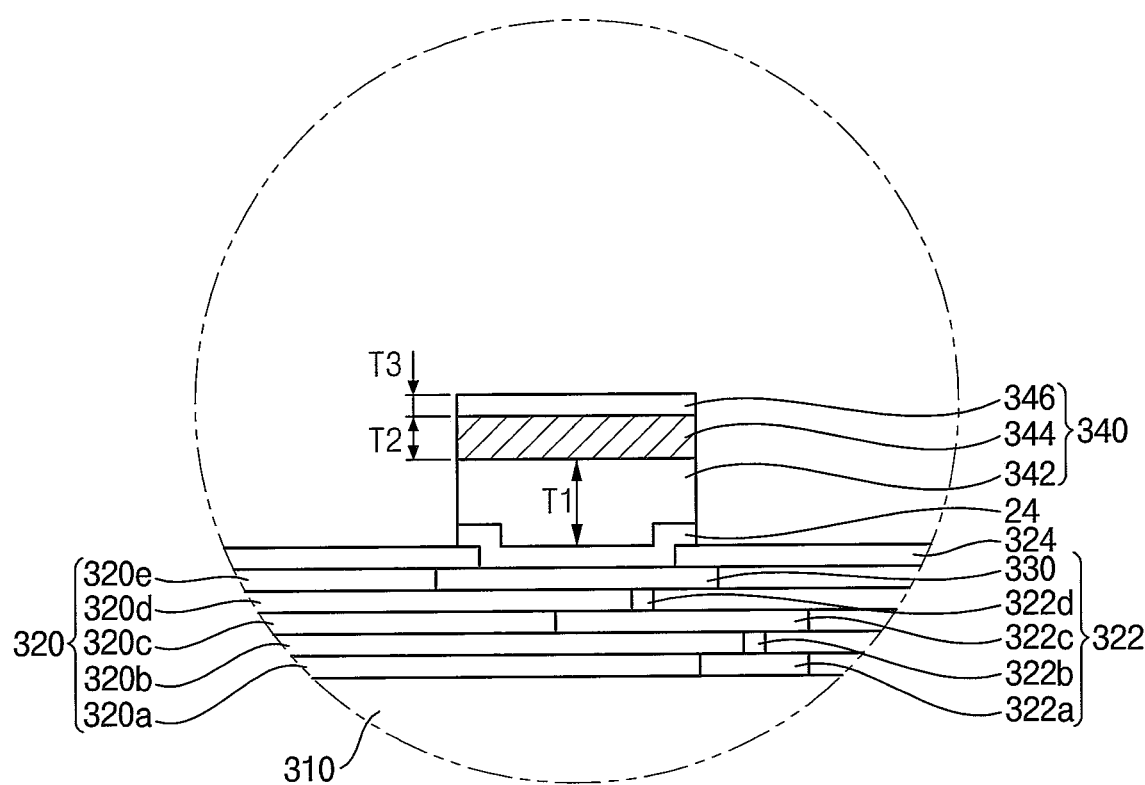
Figure 11:
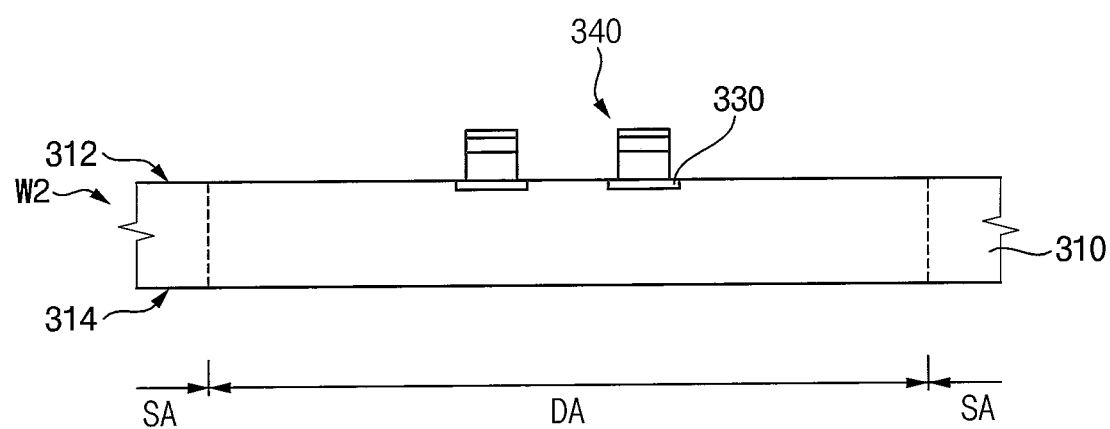

As illustrated in FIGS. 10 and 11, the photoresist pattern 30 may be removed to form the second metal bump structure 340 including the first to third metal patterns 342, 344, and 346 on the third pad 330 on the substrate 310. In this case, the seed layer 22 may be partially etched to form a seed layer pattern 24.

A diameter of the second metal bump structure 340 may be within a range of about 2 μm to about 15 μm. The second metal bump structure 340 may have a second height from the first surface 312 of the substrate 310. The second height may be within a range of about 2 μm to about 30 μm. The first thickness T1 of the first metal pattern 342 may be within a range of about 70% to about 85% of the second height of the second metal bump structure 340. The second thickness T2 of the second metal pattern 344 may be within a range of about 10% to about 20% of the second height of the second metal bump structure 340. The third thickness T3 of the third metal pattern 346 may be within a range of about 5% to about 10% of the second height of the second metal bump structure 340.

Accordingly, the second metal bump structure 340 may include the first and second main metal patterns 342 and 346 including the pillar-shaped copper material and the sub metal pattern 344 interposed therebetween and including the metal having the coefficient of thermal expansion greater than that of copper.

Referring to FIGS. 12 to 15, first metal bump structures 240 may be formed on first pads 230 of a first semiconductor chip, respectively.

Figure 12:
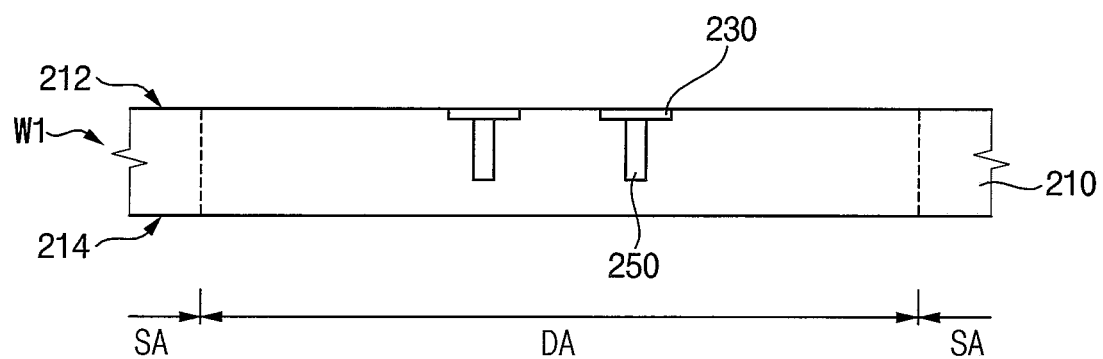

As illustrated in FIG. 12, a first wafer W1 including the first semiconductor chip in a wafer level may be prepared.

In an exemplary embodiment of the present inventive concept, the first wafer W1 may include a substrate 210, the first pad 230 provided on a first surface 212 of the substrate 210, and a through electrode 250. The substrate 210 may include a die region DA and a scribe lane region SA. The die region DA is a region where circuit patterns and cells are formed, and the scribe lane region SA at least partially surrounds the die region DA. As described later, the substrate 210 may be sawed along the scribe lane region SA dividing the die regions DA to form an individual semiconductor chip.

Figure 19:
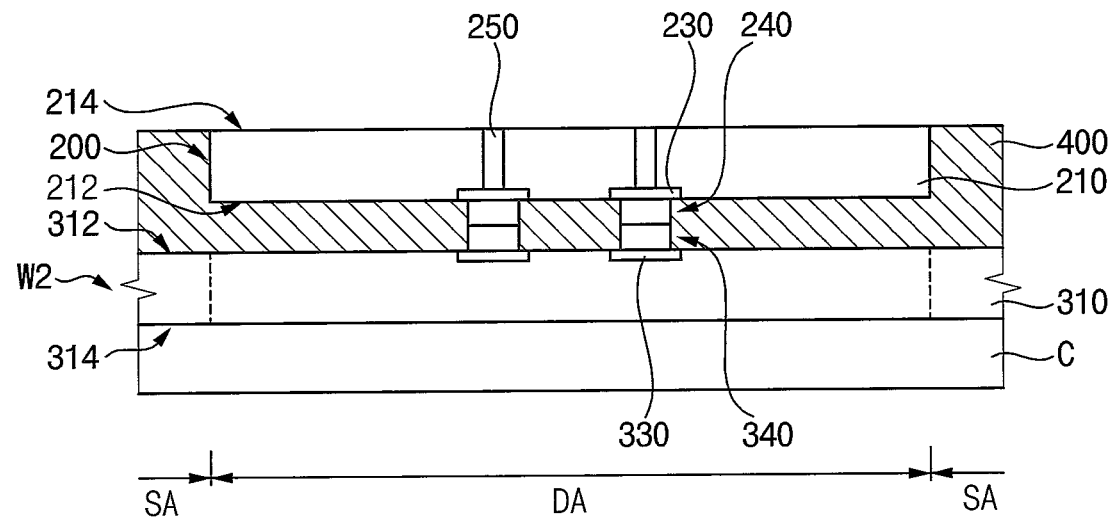

As illustrated in FIG. 14, the through electrode 250 may be provided to penetrate the substrate 210. The through electrode 250 may be electrically connected to the first pad 230 through a wiring 222 in an insulation interlayer 220. The through electrode 250 may be formed before polishing a backside surface of the substrate 210, for example, a second surface 214 as illustrated in FIG. 19 (via first process and via middle process). In addition, the through electrode 250 may be formed after polishing the backside surface of the substrate 210 as illustrated in FIG. 19 (via last process).

As illustrated in FIGS. 13 and 14, processes the same as or similar to the processes described with reference to FIGS. 5 to 10 may be performed to form the first metal bump structure 240 including first to third metal patterns 242, 244, and 246.

The first metal bump structure 240 may be substantially the same as or similar to the second metal bump structure 340. Thus, same or like reference numerals will be used to refer to the same or like elements and repeated descriptions of the same elements may be omitted.

Figure 15:
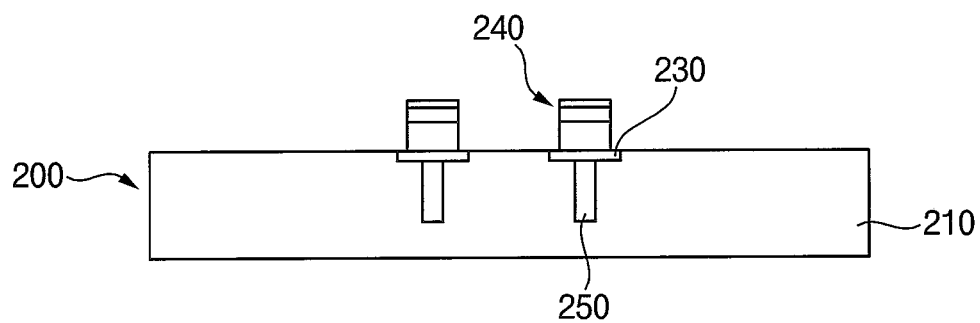

As illustrated in FIG. 15, the first wafer W1 may be cut along the scribe lane region SA to form an individualized first semiconductor chip 200.

Figure 16:
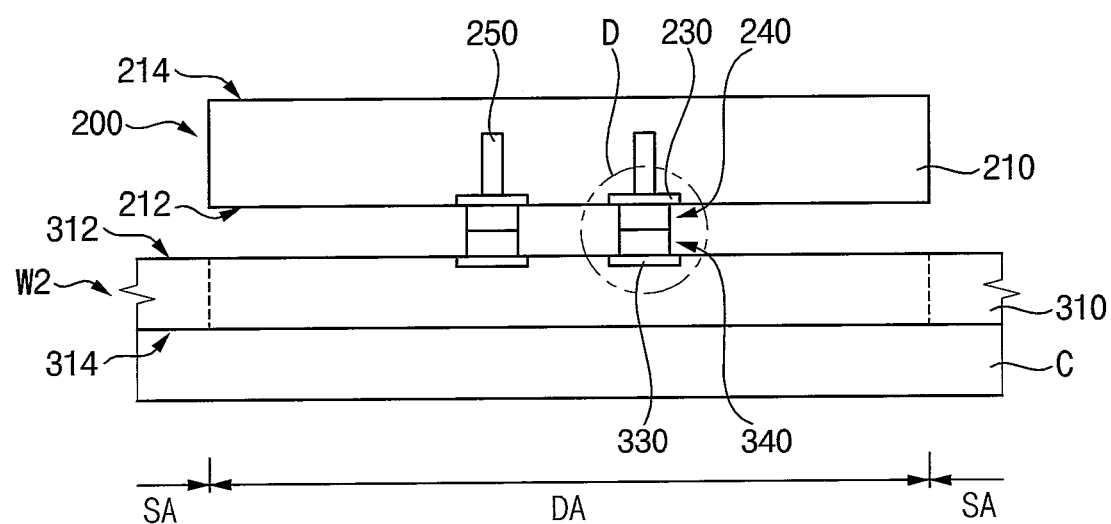
Figure 17:
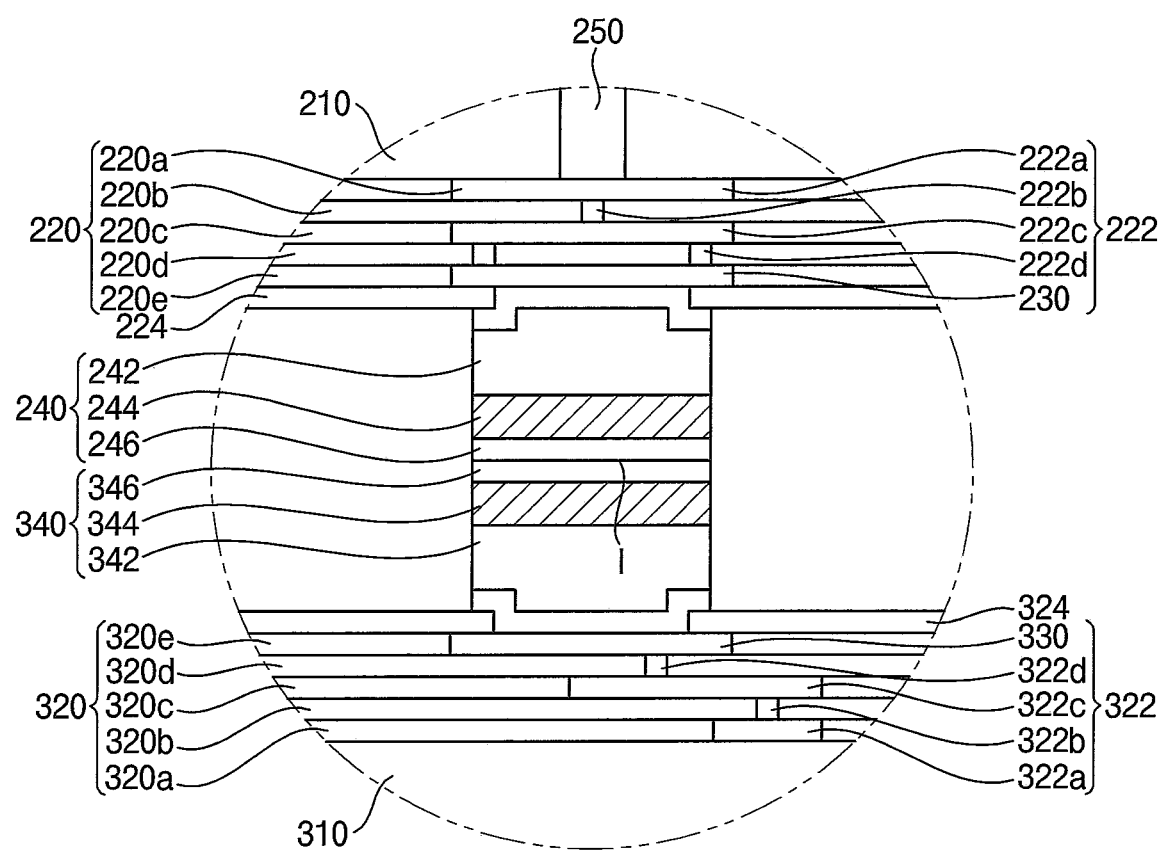

Referring to FIGS. 16 and 17, a plurality of the first semiconductor chips 200 may be arranged on the second wafer W2. The first semiconductor chip 200 may be bonded to the second semiconductor chip of the second wafer W2.

As illustrated in FIG. 16, after arranging the second wafer W2 to be supported on a carrier substrate, the first semiconductor chips 200 may be arranged on the second wafer W2 corresponding to the die regions DA. The first semiconductor chip 200 may be stacked on the second wafer W2 such that the first surface 212 of the first semiconductor chip 200 faces the second wafer W2.

The first semiconductor chips 200 may be attached on the second semiconductor chips of the second wafer W2 by performing a thermal compression process at a predetermined temperature (e.g., a temperature range of about 380° C. to about 450° C.). By the thermal compression process, the first metal bump structure 240 of the first semiconductor chip 200 and the second metal bump structure 340 may be directly bonded to each other (e.g., Cu—Cu Bonding).

As illustrated in FIG. 17, a junction surface I may be formed between the third metal pattern 246 of the first metal bump structure 240 and the third metal pattern 346 of the second metal bump structure 340.

Since the second metal patterns 244 and 344 respectively disposed on the third metal patterns 246 and 346 include a metal having the coefficient of thermal expansion greater than that of copper, a local load may be applied to the third metal patterns 246 and 346 to induce a sufficient diffusion at the junction I between the first metal bump structure 240 and the second metal bump structure 340 during the high-temperature thermal compression process, thereby providing excellent bonding properties.

Figure 18:
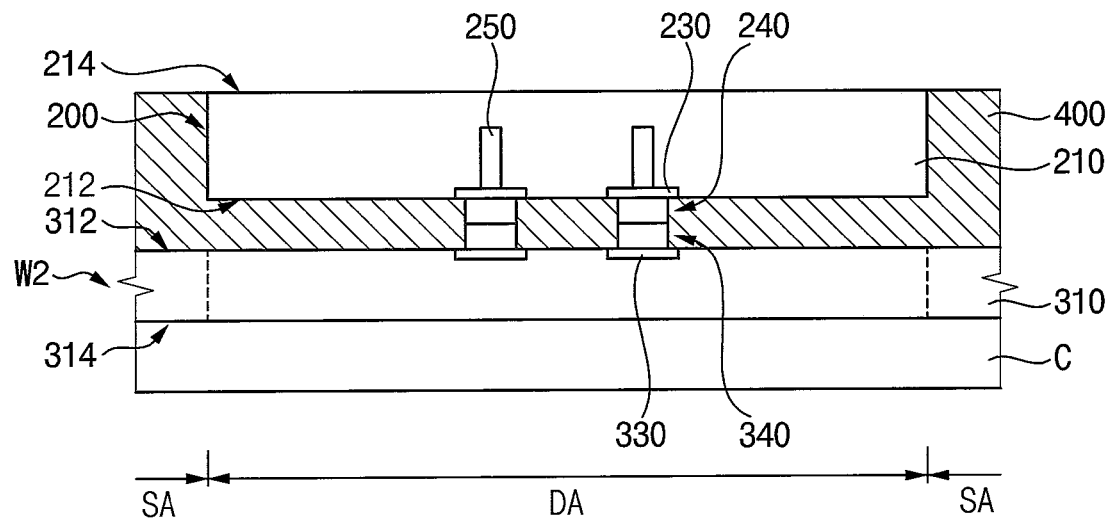

Referring to FIG. 18, a filling support layer 400 may be formed to fill a space between adjacent first semiconductor chips 200 and between the first semiconductor chip 200 and the second wafer W2.

In an exemplary embodiment of the present inventive concept, the filling support layer 400 may be formed on the second wafer W2 to fill the space between adjacent first semiconductor chips 200 and between the first semiconductor chip 200 and the second wafer W2.

The filling support layer 400 may be formed to at least partially surround the first semiconductor chip 200. For example, an upper surface of the filling support layer 400 may be substantially coplanar with an upper surface of the first semiconductor chip 200. For example, the filling support layer 400 may be formed by a molding process, a dispensing process, or a spin coating process. For example, the filling support layer 400 may include a thermosetting resin or the like.

Figure 20:
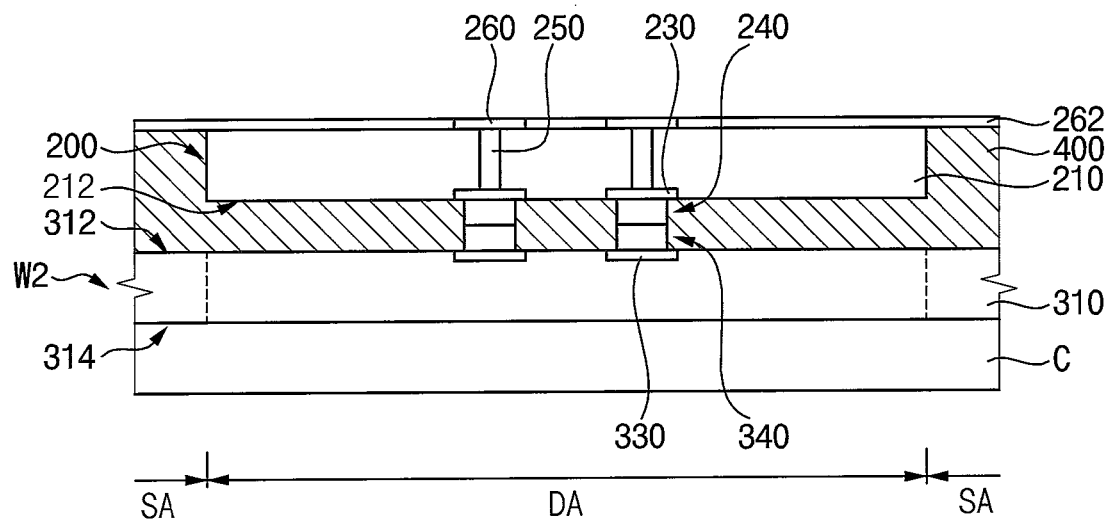

Referring to FIGS. 19 and 20, a second surface 214 of the first semiconductor chip 200 may be grinded to expose the through electrode 250 and a second pad 260 may be formed on the second surface 214 of the first semiconductor chip 200.

An insulating layer 262 may be formed on the second surface 214 of the first semiconductor chip 200. The insulating layer 262 may include openings exposing the second pad 260. The second pad 260 may be formed on a first end portion of the through electrode 250.

When the through electrode 250 is formed by a via last process, the step of forming the second pad 260 may be performed at or after forming the through electrode 250.

Figure 21:
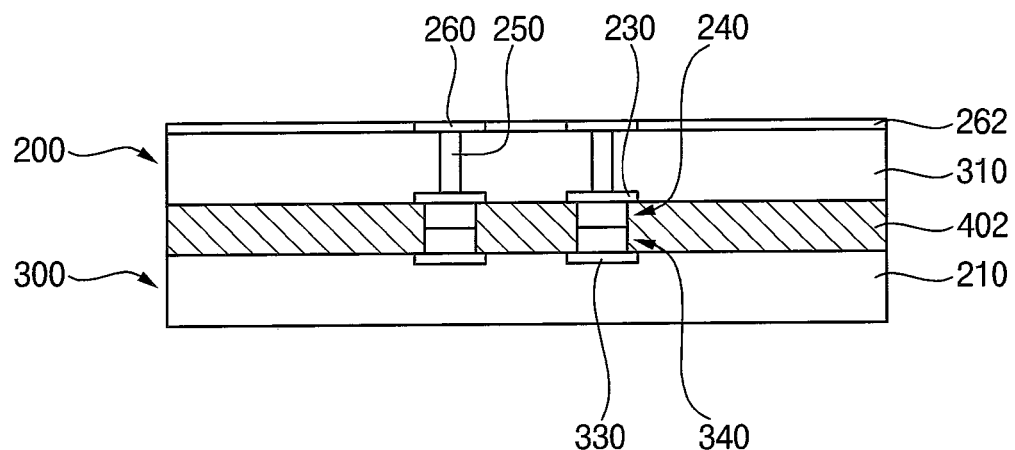

Referring to FIG. 21, the carrier substrate C may be removed from the second wafer W2, and then, the second wafer W may be cut along the scribe lane region SA to form an individualized second semiconductor chip. A filling support layer pattern 402, which may be an adhesive member, may be interposed between the first and second semiconductor chips 200 and 300.

Then, the stacked first and second semiconductor chips 200 and 300 may be mounted on a package substrate. In addition, a molding member may be formed on an upper surface of the package substrate to cover the first and second semiconductor chips 200 and 300, and then, outer connection members may be formed on outer connection pads on a lower surface of the package substrate to form the semiconductor package in FIG. 1.

In this embodiment, the first and second metal bump structures 240 and 340 are bonded to each other by a die-to-wafer bonding method, however, the present inventive concept may not be limited thereto. For example, it may be understood that the first and second metal bump structures 240 and 340 may be bonded to each other by a die-to-die bonding method or a wafer-to-wafer bonding method.

Figure 22:
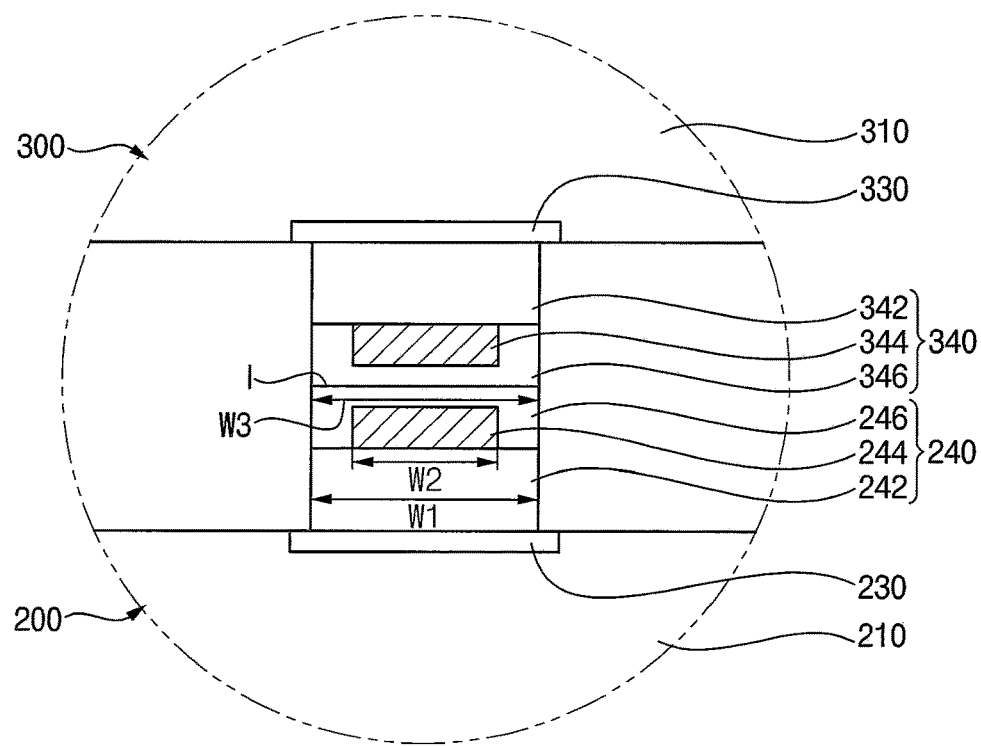
FIG. 22 is a cross-sectional view illustrating a semiconductor package in accordance with an exemplary embodiment of the present inventive concept.

FIG. 22 is a cross-sectional view illustrating a semiconductor package in accordance with an exemplary embodiment of the present inventive concept. The semiconductor package may be substantially the same as or similar to the semiconductor package described with reference to FIGS. 1 and 2 except for configurations of metal bump structures. Thus, same reference numerals will be used to refer to the same or like elements and any further repetitive explanation concerning the above elements may be omitted.

Referring to FIG. 22, a conductive connector of a semiconductor package may include a first metal bump structure 240 and a second metal bump structure 340. The first metal bump structure 240 may be provided on a first pad 230 of a first semiconductor chip 200, and the second metal bump structure 340 may be provided on a third pad 330 of a second semiconductor chip 300.

In an exemplary embodiment of the present inventive concept, the first metal bump structure 240 may include first to third metal patterns 242, 244, and 246 sequentially stacked on the first pad 230. The first and third metal patterns 242 and 246 may serve as a main pattern. The first metal pattern 242 may serve as a first main pattern, and the second metal pattern 246 may serve as a second main pattern. The second metal pattern 244 may serve as a sub pattern and may be provided within the main pattern.

The first metal pattern 242 may have a first width W1. The second metal pattern 244 may have a second width W2, and the third metal pattern 246 may have a third width W3. The third width W3 of the third metal pattern 346 may be the same as the first width W1 of the first metal pattern 342. However, the present inventive concept is not limited thereto. For example, the third metal pattern 346 may have a width different from that of the first metal pattern 342.

In an exemplary embodiment of the present inventive concept, each of the first metal pattern 242 and the third metal pattern 246 may have a cuboid shape, a cylindrical shape or a triangular prism shape. However, the present inventive concept is not limited thereto.

The second metal pattern 244 may cover a central region of the first metal pattern 242, and the third metal pattern 246 may be provided on the first metal pattern 242 to cover the second metal pattern 244. For example, the second metal pattern 244 may have a cylindrical shape. Accordingly, side surfaces and an upper surface of the second metal pattern 244 may be covered by the third metal pattern 246.

Similarly, the second metal bump structure 340 may include first to third metal patterns 342, 344, and 346 sequentially stacked on the third pad 330.

Upper surfaces of the third metal patterns 246 and 346, for example, bonding surfaces may have a dishing type according to a plating solution or an additive in an electroplating process. When the upper surfaces of the third metal patterns 246 and 346 come into contact with each other and since the second metal patterns 244 and 344 are located in the central regions of the respective third metal patterns 246 and 346, a local load may be applied to the central portions of the third metal patterns 246 and 346 during a high-temperature thermo compression bonding process to provide excellent bonding properties.

Hereinafter, a method of manufacturing the semiconductor package in FIG. 22 will be explained.

FIGS. 23 to 29 are cross-sectional views illustrating a method of manufacturing a semiconductor package in accordance with an exemplary embodiment of the present inventive concept.

Referring to FIGS. 23 to 29, a second metal bump structure 340 may be formed on a third pad 330 of a second semiconductor chip.

Figure 23:
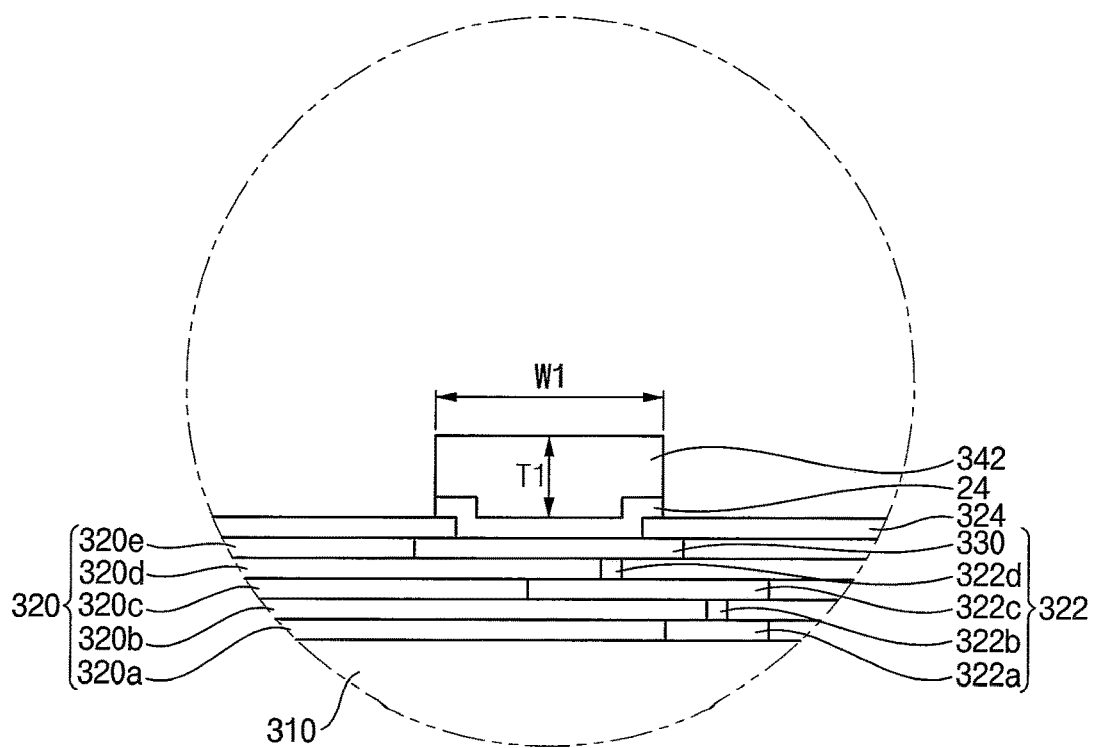
FIGS. 23, 24, 25, 26, 27, 28 and 29 are cross-sectional views illustrating a method of manufacturing a semiconductor package in accordance with an exemplary embodiment of the present inventive concept.

As illustrated in FIG. 23, processes the same as or similar to the processes described with reference to FIGS. 3 to 7 may be performed to form a first metal pattern 342 on the third pad 330.

In an exemplary embodiment of the present inventive concept, a first plating process may be performed on a seed layer 22 to form the first metal pattern 342 including a first metal material.

For example, the first metal material may include copper (Cu). The first metal pattern 342 may have a first coefficient of thermal expansion. The first metal pattern 342 may have a first thickness T1. The first thickness T1 of the first metal pattern 342 may be within a range of about 1 μm to about 20 μm. The first metal pattern 342 may have a first width W1.

The first width W1 of the first metal pattern 342 may be within a range of about 2 μm to about 15 μm.

A first photoresist pattern used in the first plating process may be removed from a substrate 310 to form the first metal pattern 342 on the third pad 330 of the substrate 310. The seed layer 22 may be partially etched to form a seed layer pattern 24.

Figure 24:
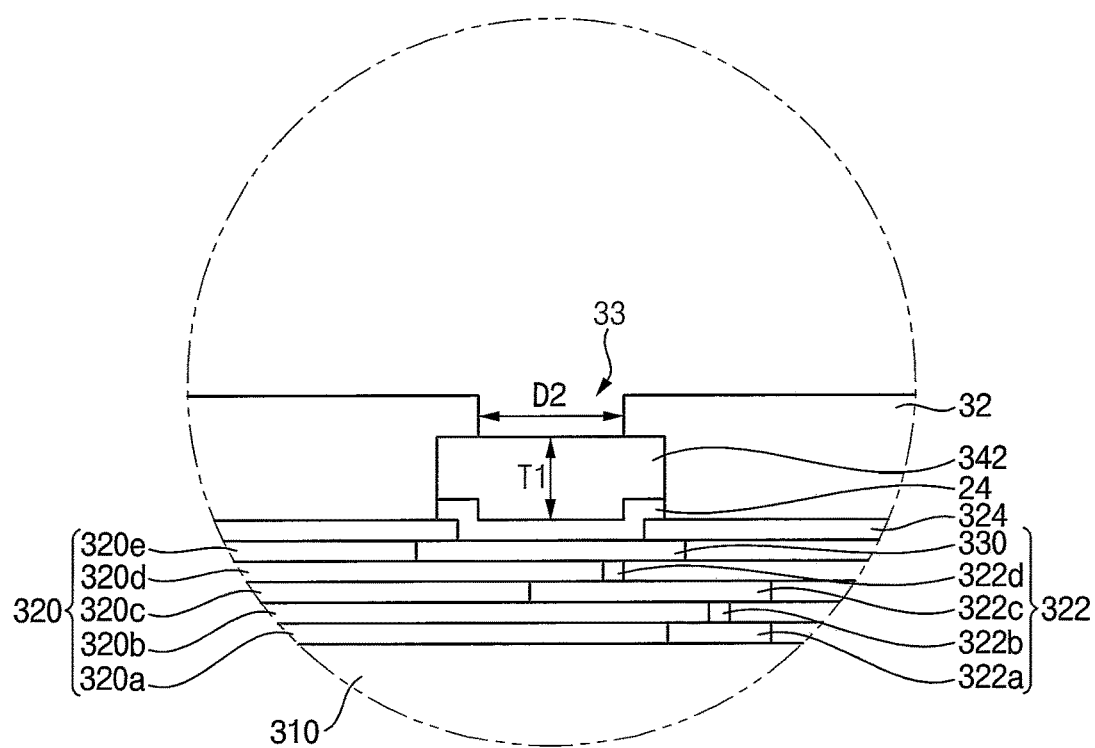

As illustrated in FIG. 24, a second photoresist pattern 32 may be formed on a first surface 312 of the substrate 310 to cover a portion of the first metal pattern 342.

A photoresist layer may be formed on the first surface 312 of the substrate 310 to cover the first metal pattern 342, and an exposure process may be performed on the photoresist layer to form the second photoresist pattern 32 having a second opening 33 that exposes a central region of the first metal pattern 342.

Figure 25:
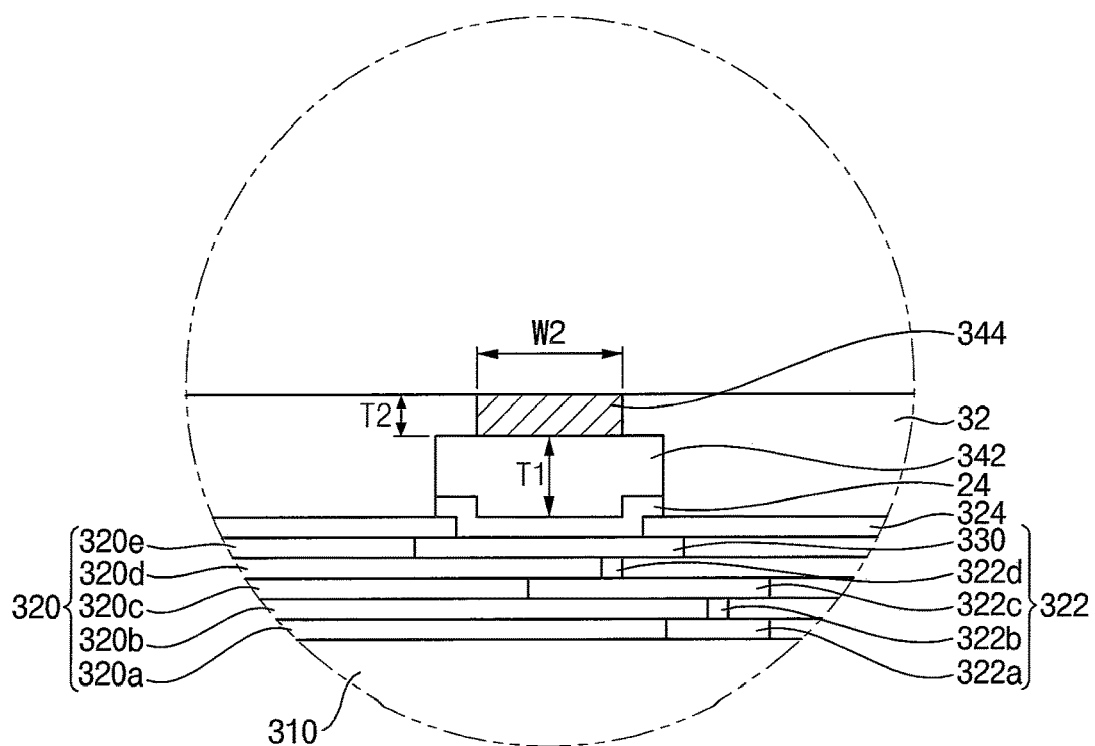
Figure 26:
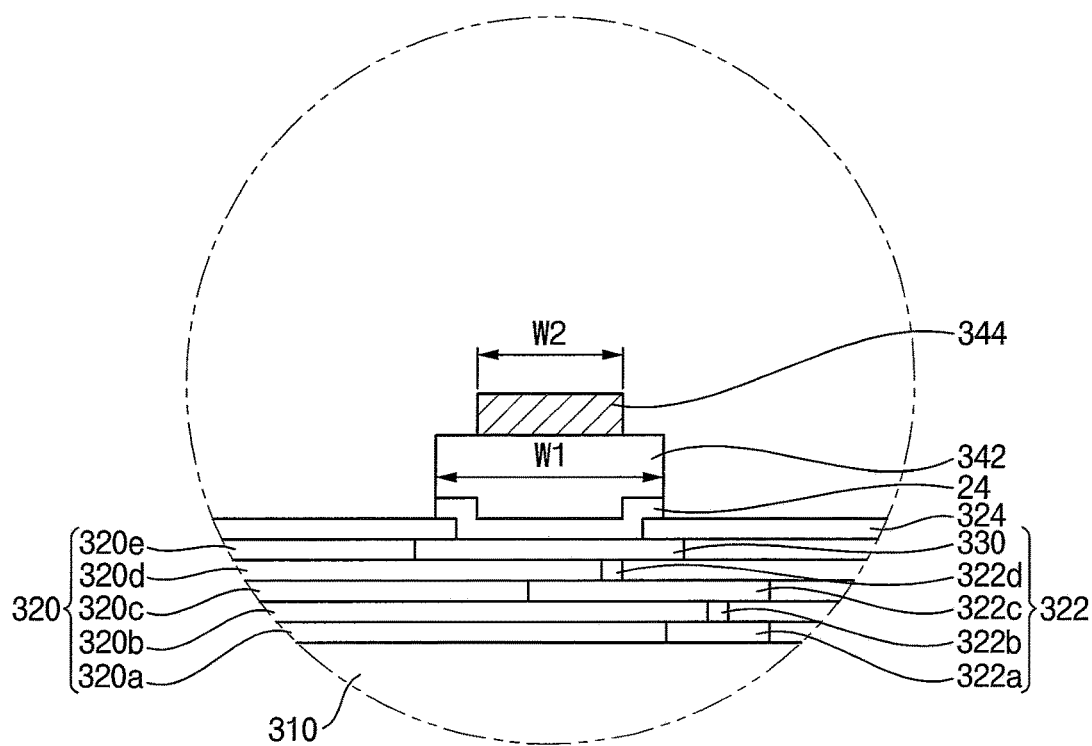

As illustrated in FIGS. 25 and 26, a second plating process may be performed on the first metal pattern 342 exposed by the second photoresist pattern 32 to form a second metal pattern 344 including a second metal material, and the second photoresist pattern 32 may be removed from the substrate 310.

The second metal pattern 344 may have a cylindrical shape having a second thickness T2. The second metal pattern 344 may cover the central region of the first metal pattern 342 and expose a peripheral region of the first metal pattern 342. For example, the second metal pattern 344 may expose edges of the first metal pattern 342.

For example, the second metal material may include zinc (Zn), aluminum (Al), silver (Ag), etc. The second metal material may have a second coefficient of thermal expansion greater than the first coefficient of thermal expansion of the first metal material. The second metal pattern 344 may have a second thickness T2 smaller than the first thickness T1. A second width W2 of the second metal pattern 344 may be smaller than the first width W1 of the first metal pattern 342.

Figure 27:
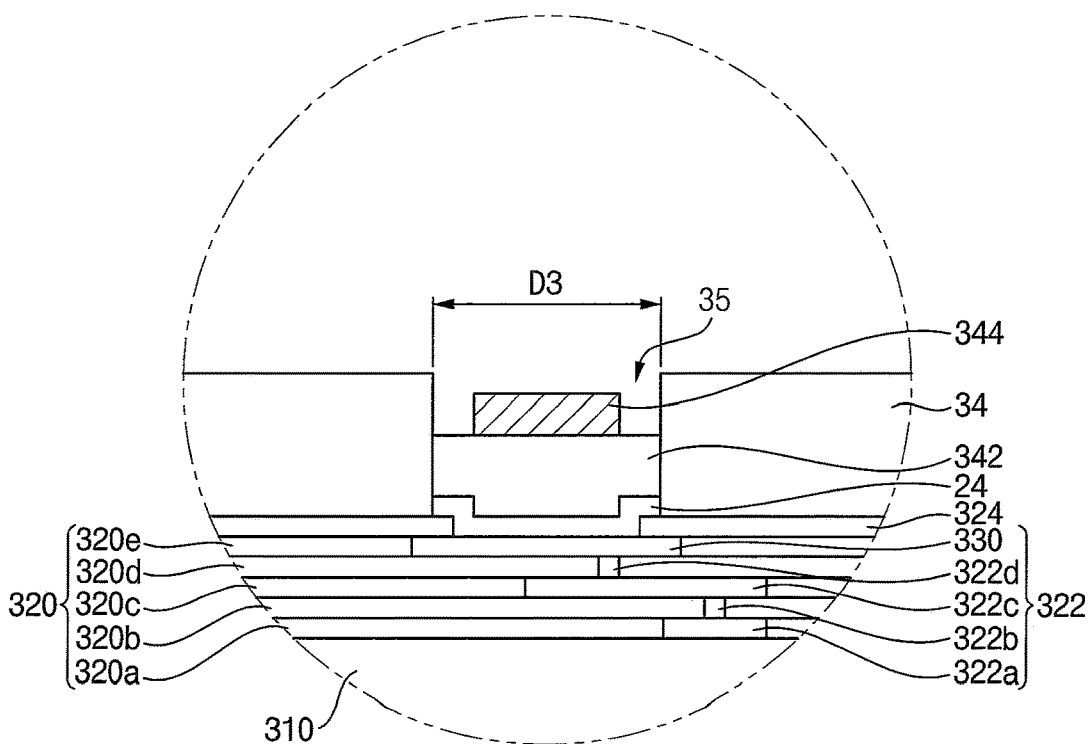

As illustrated in FIG. 27, a third photoresist pattern 34 may be formed on the first surface 312 of the substrate 310 and may expose the first and second metal patterns 342 and 344.

A photoresist layer may be formed on the first surface 312 of the substrate 310 to cover the first and second metal pattern 342 and 344, and an exposure process may be performed on the photoresist layer to form the third photoresist pattern 34 having a third opening 35 that exposes upper surfaces of the first and second metal patterns 342 and 344.

Figure 28:
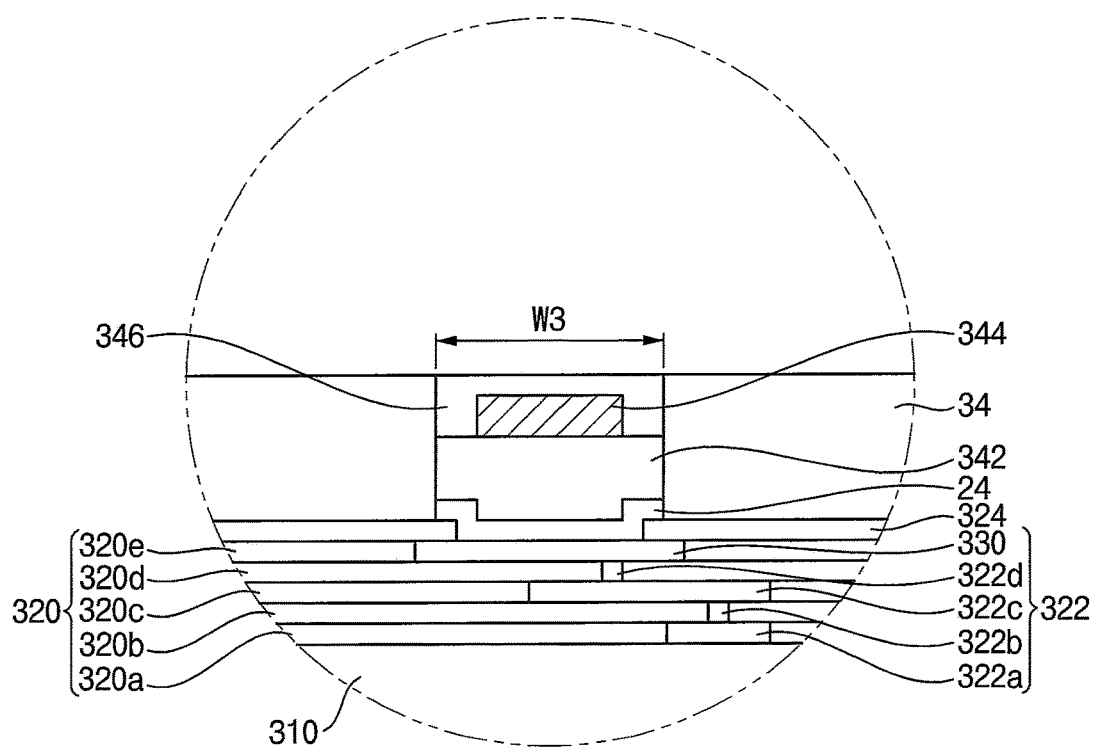

As illustrated in FIG. 28, a third plating process may be performed on the first and second metal patterns 342 and 344 exposed by the third photoresist pattern 34 to form a third metal pattern 346 including a third metal material.

The third metal pattern 346 may be formed on the first metal pattern 342 to cover the second metal pattern 344. Side surfaces and the upper surface of the second metal pattern 344 may be covered by the third metal pattern 346.

For example, the third metal material may include the same metal as the first metal material. The third metal pattern 346 may have a third thickness T3 smaller than the second thickness T2 of the second metal pattern 344. A third width W3 of the third metal pattern 346 may be greater than the second width W2 of the second metal pattern 344 and may be the same as the first width W1 of the first metal pattern 342.

Figure 29:
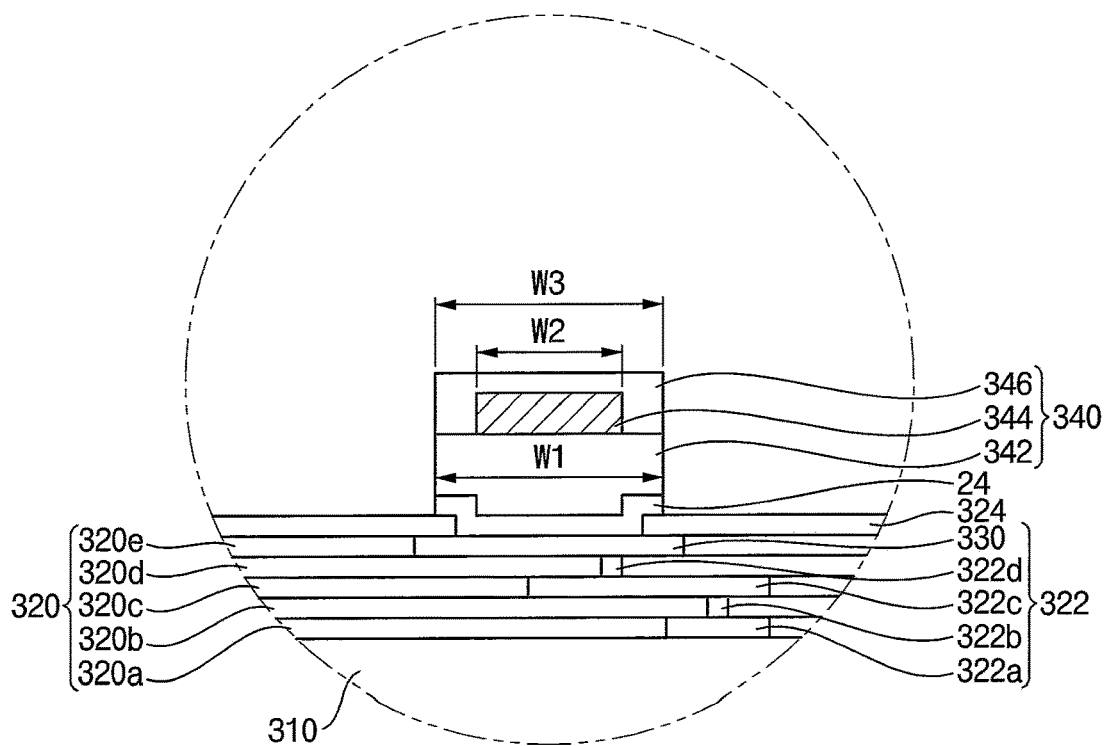

As illustrated in FIG. 29, the third photoresist pattern 34 may be removed from the substrate 310 to form the second metal bump structure 340 including the first to third metal patterns 342, 344, and 346 on the third pad 330 of the substrate 310.

Then, processes the same as or similar to the processes described with reference to FIGS. 12 to 15 and 23 to 29 may be performed to form a first metal bump structure 240 on a first pad 230 of the first semiconductor chip.

Then, processes the same as or similar to the processes described with reference to FIGS. 16 to 21 may be performed to bond the first and second semiconductor chips to each other to provide the semiconductor package in FIG. 21.

Figure 30:
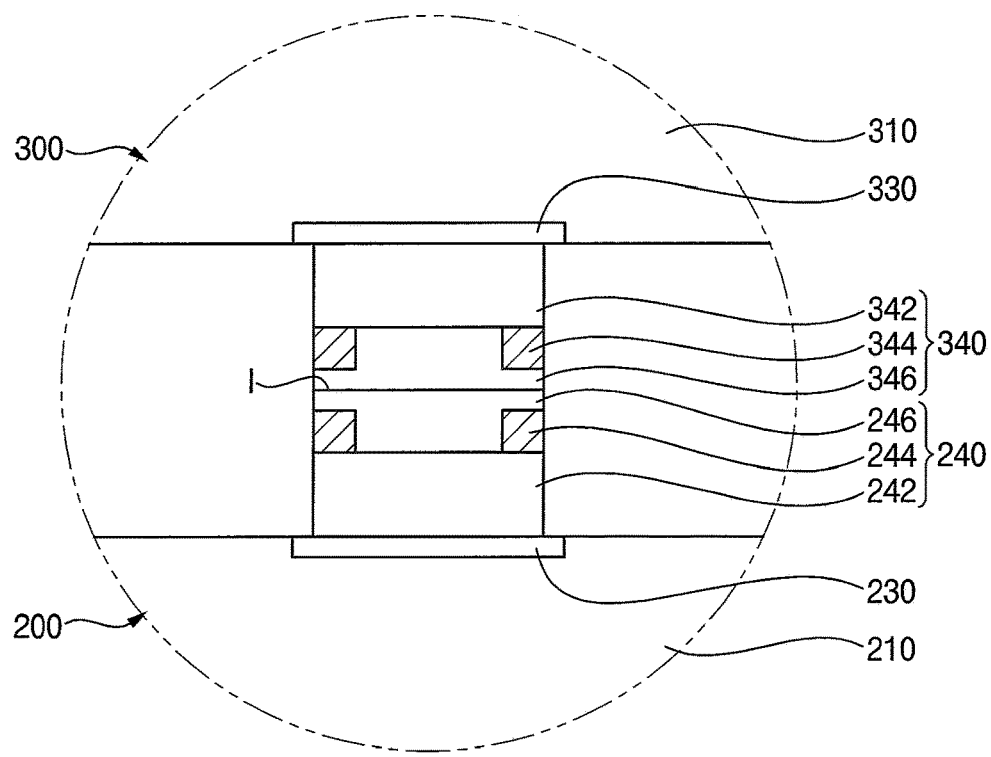
FIG. 30 is a cross-sectional view illustrating a semiconductor package in accordance with an exemplary embodiment of the present inventive concept.

FIG. 30 is a cross-sectional view illustrating a semiconductor package in accordance with an exemplary embodiment of the present inventive concept. The semiconductor package may be substantially the same as or similar to the semiconductor package described with reference to FIGS. 1 and 2 except for configurations of metal bump structures. Thus, same reference numerals will be used to refer to the same or like elements and any further repetitive description concerning the above elements may be omitted.

Referring to FIG. 30, a first metal bump structure 240 may include first to third metal patterns 242, 244, and 246 sequentially stacked on a first pad 230. The first and third metal patterns 242 and 246 may be a main pattern. The first metal pattern 242 may be a first main pattern, and the second metal pattern 246 may be a second main pattern. The second metal pattern 244 may be a sub pattern and may be provided within the main pattern.

The second metal pattern 244 may have, for example, an annular shape covering a peripheral region of the first metal pattern 242, and the third metal pattern 246 may be provided on the first metal pattern 242 to cover the second metal pattern 244. Accordingly, side surfaces of the second metal pattern 244 may be exposed to the outside. In an exemplary embodiment of the present inventive concept, the second metal pattern 244 may have a polygonal shape with an opening.

Similarly, the second metal bump structure 340 may include first to third metal patterns 342, 344, and 346 sequentially stacked on the third pad 330.

Upper surfaces of the third metal patterns 246 and 346 may be bonding surfaces and may have a doming type according to a plating solution or an additive in an electroplating process. For example, the upper surface of the third metal pattern 346 of the second metal bump structure 340 may be a lower surface when disposed on the upper surface of the third metal pattern 246 of the first metal bump structure 240. When the upper surfaces of the third metal patterns 246 and 346 come into contact with each other and since the second metal patterns 244 and 344 are respectively located in peripheral regions of the third metal patterns 246 and 346, a local load may be applied to the peripheral portions of the third metal patterns 246 and 346 during a high-temperature thermo compression bonding process to provide excellent bonding properties.

Hereinafter, a method of manufacturing the semiconductor package in FIG. 30 will be explained.

FIGS. 31 to 36 are cross-sectional views illustrating a method of manufacturing a semiconductor package in accordance with an exemplary embodiment of the present inventive concept.

Referring to FIGS. 31 to 36, a second metal bump structure 340 may be formed on a third pad 330 of a second semiconductor chip 300.

Figure 31:
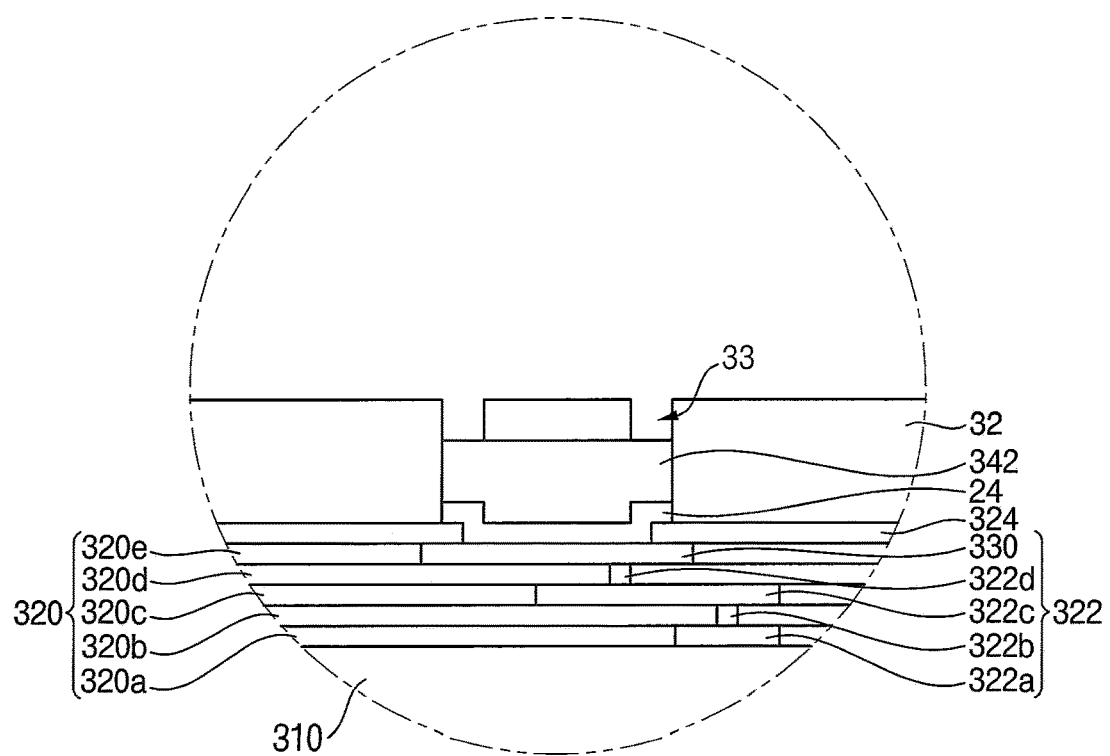
FIGS. 31, 32, 33, 34, 35 and 36 are cross-sectional views illustrating a method of manufacturing a semiconductor package in accordance with an exemplary embodiment of the present inventive concept.

As illustrated in FIG. 31, the processes to form the first metal pattern 342 described with reference to FIGS. 3 to 7 may be performed to form a first metal pattern 342 on the third pad 330, and a second photoresist pattern 32 may be formed on a first surface 312 of a substrate 310 to form a second photoresist pattern 32.

A photoresist layer may be formed on the first surface 312 of the substrate 310 to cover the first metal pattern 342, and an exposure process may be performed on the photoresist layer to form the second photoresist pattern 32 having a second opening 33 that exposes a peripheral region of the first metal pattern 342.

Figure 32:
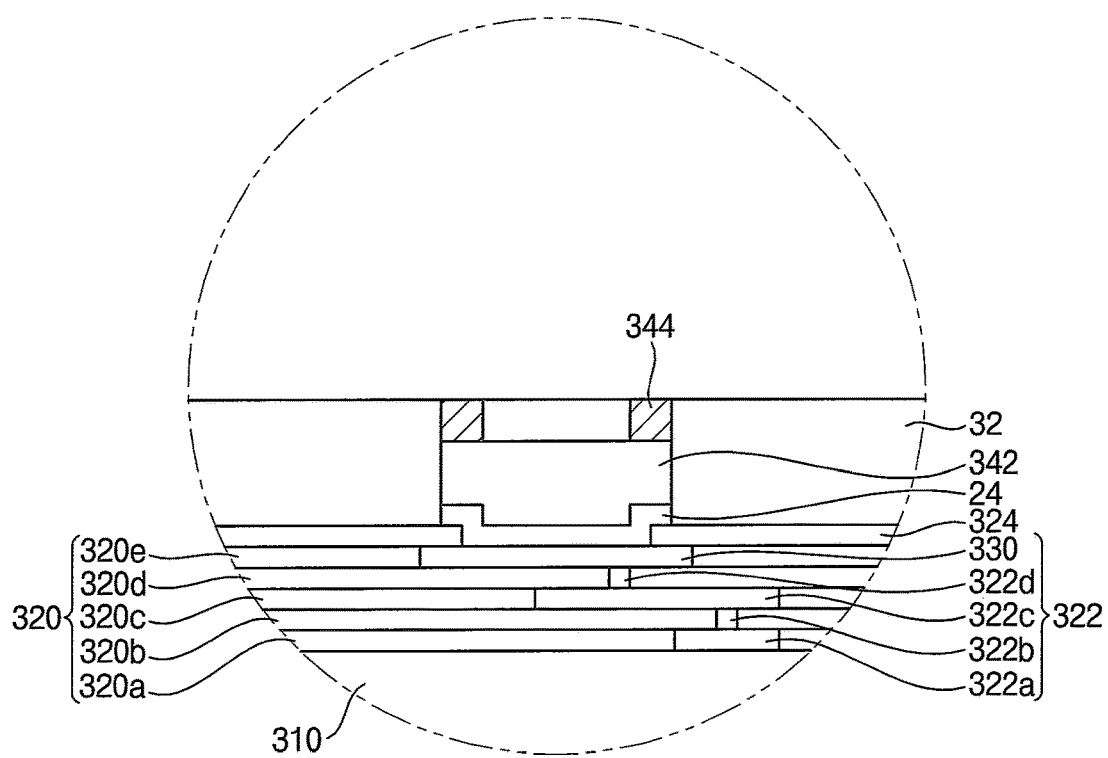
Figure 33:
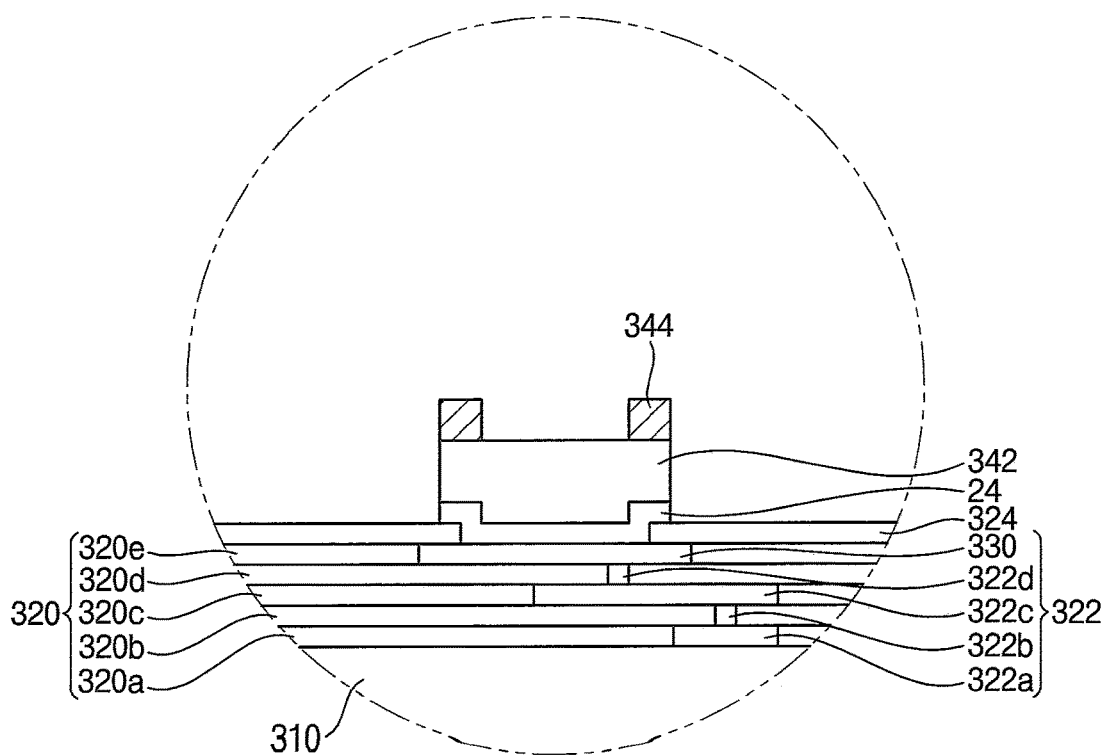

As illustrated in FIGS. 32 and 33, a second plating process may be performed on the first metal pattern 342 exposed by the second photoresist pattern 32 to form a second metal pattern 344 including a second metal material, and the second photoresist pattern 32 may be removed from the substrate 310.

The second metal pattern 344 may have, for example, an annular shape having a second thickness T2. However, the present inventive concept is not limited thereto. For example, the second metal pattern 344 may have a polygonal shape with an opening. The second metal pattern 344 may cover a peripheral region of the first metal pattern 342 and expose a central region of the first metal pattern 342.

Figure 34:
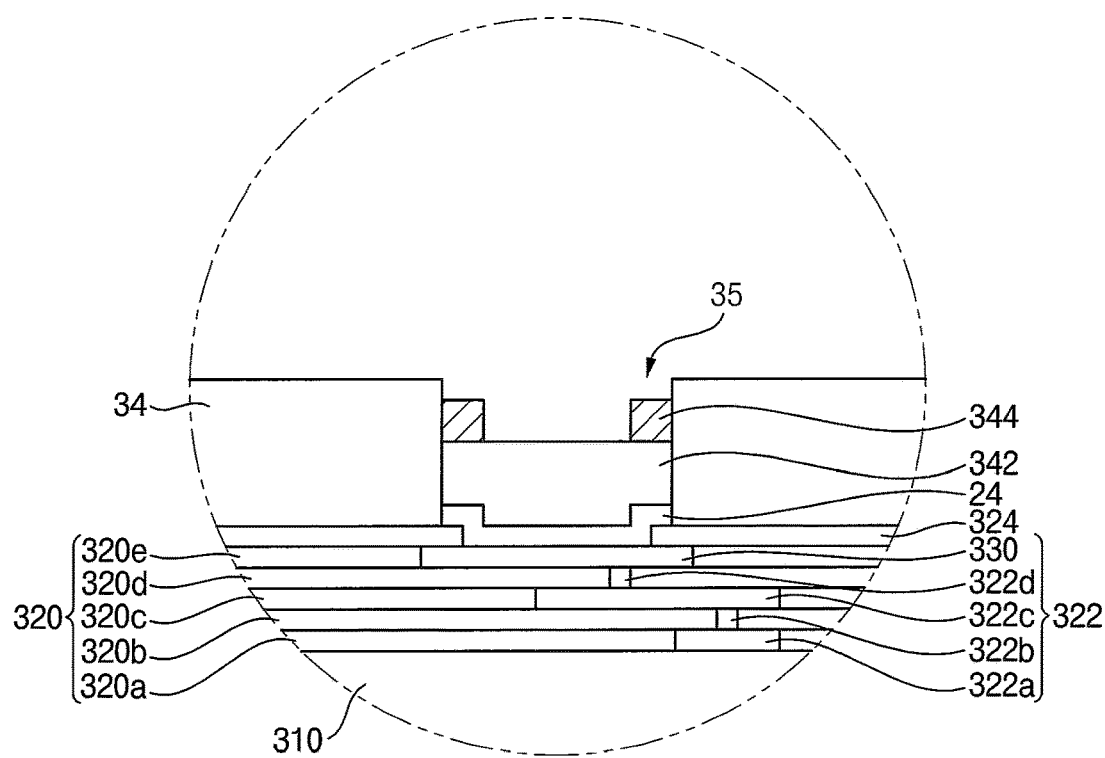

As illustrated in FIG. 34, a third photoresist pattern 34 may be formed on the first surface 312 of the substrate 310 to expose the first and second metal patterns 342 and 344.

A photoresist layer may be formed on the first surface 312 of the substrate 310 to cover the first and second metal pattern 342 and 344, and an exposure process may be performed on the photoresist layer to form the third photoresist pattern 34 having a third opening 35 that exposes upper surfaces of the first and second metal patterns 342 and 344.

Figure 35:
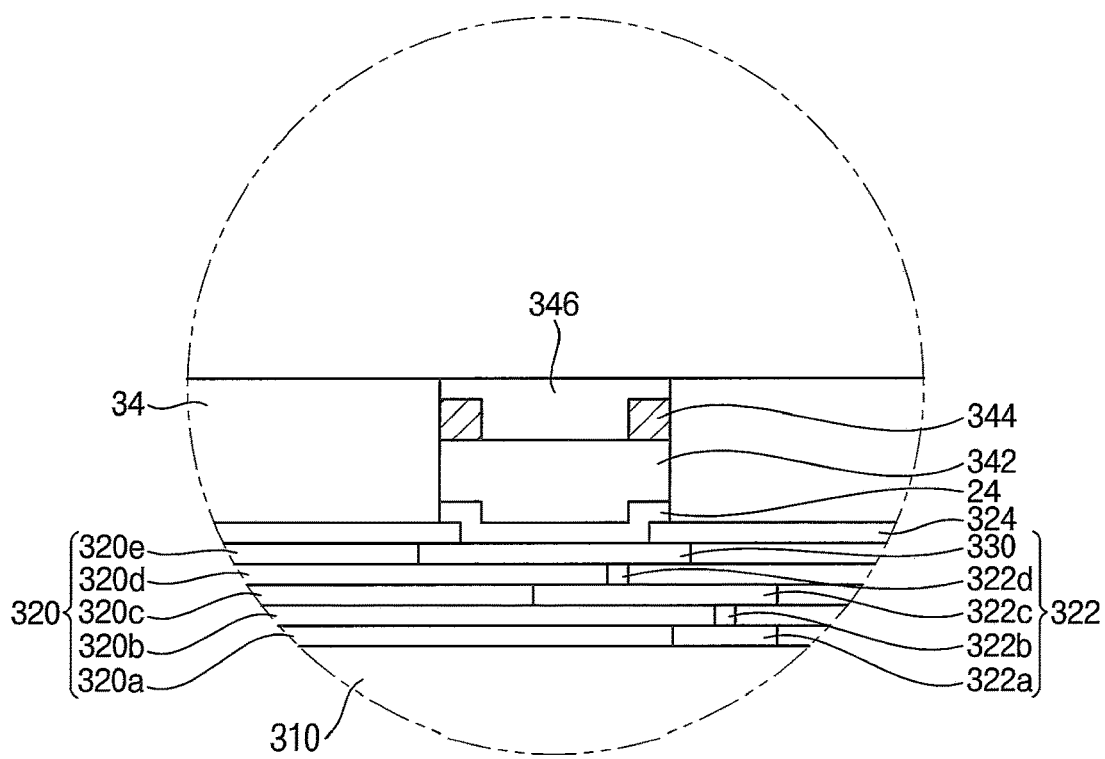

As illustrated in FIG. 35, a third plating process may be performed on the first and second metal patterns 342 and 344 exposed by the third photoresist pattern 34 to form a third metal pattern 346 including a third metal material.

The third metal pattern 346 may be formed on the first metal pattern 342 to cover the second metal pattern 344. Side surfaces of the second metal pattern 344 may be exposed from the third metal pattern 346. For example, inner surfaces of the second metal pattern 344 may be covered by the third metal pattern 346.

Figure 36:
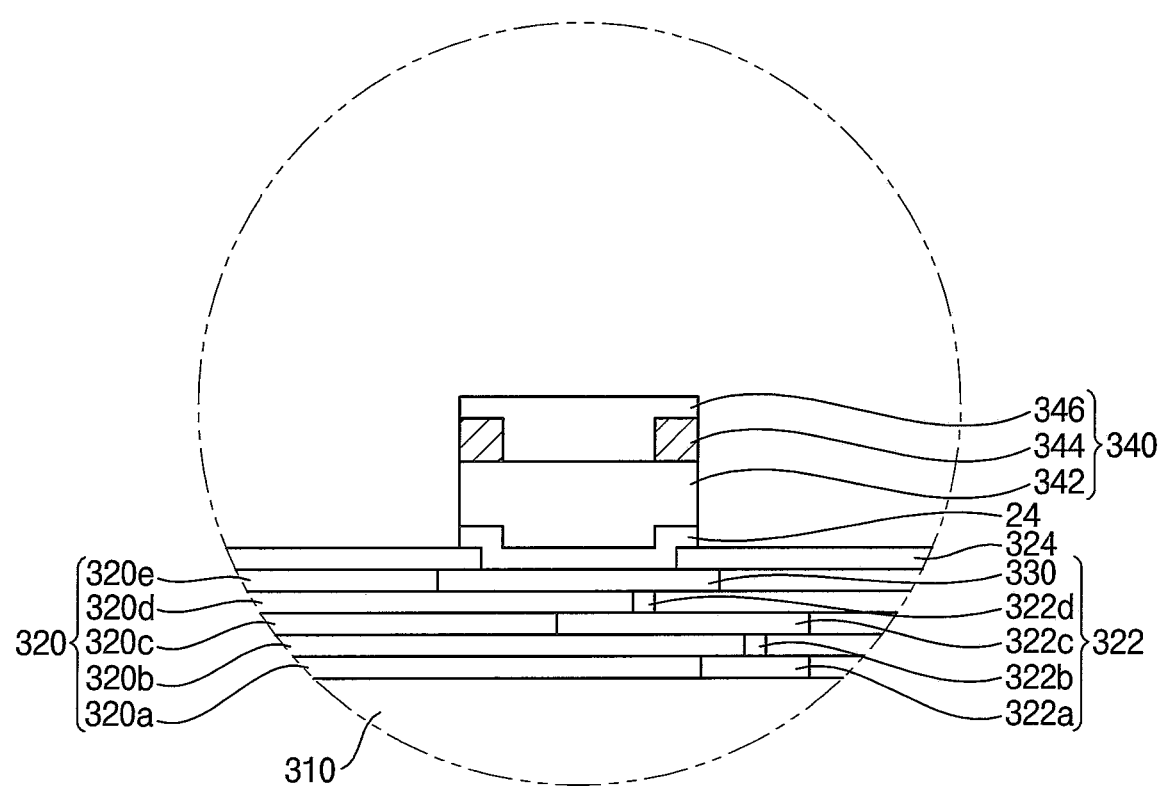

As illustrated in FIG. 36, the third photoresist pattern 34 may be removed from the substrate 310 to form the second metal bump structure 340 including the first to third metal patterns 342, 344, and 346 on the third pad 330 of the substrate 310.

Then, processes that are the same as or similar to the processes described with reference to FIGS. 12 to 15 and 31 to 36 may be performed to form a first metal bump structure 240 on a first pad 230 of the first semiconductor chip 200.

Then, processes that are the same as or similar to the processes described with reference to FIGS. 16 to 21 may be performed to bond the first and second semiconductor chips 200 and 300 to each other to form the semiconductor package in FIG. 30.

Figure 37:
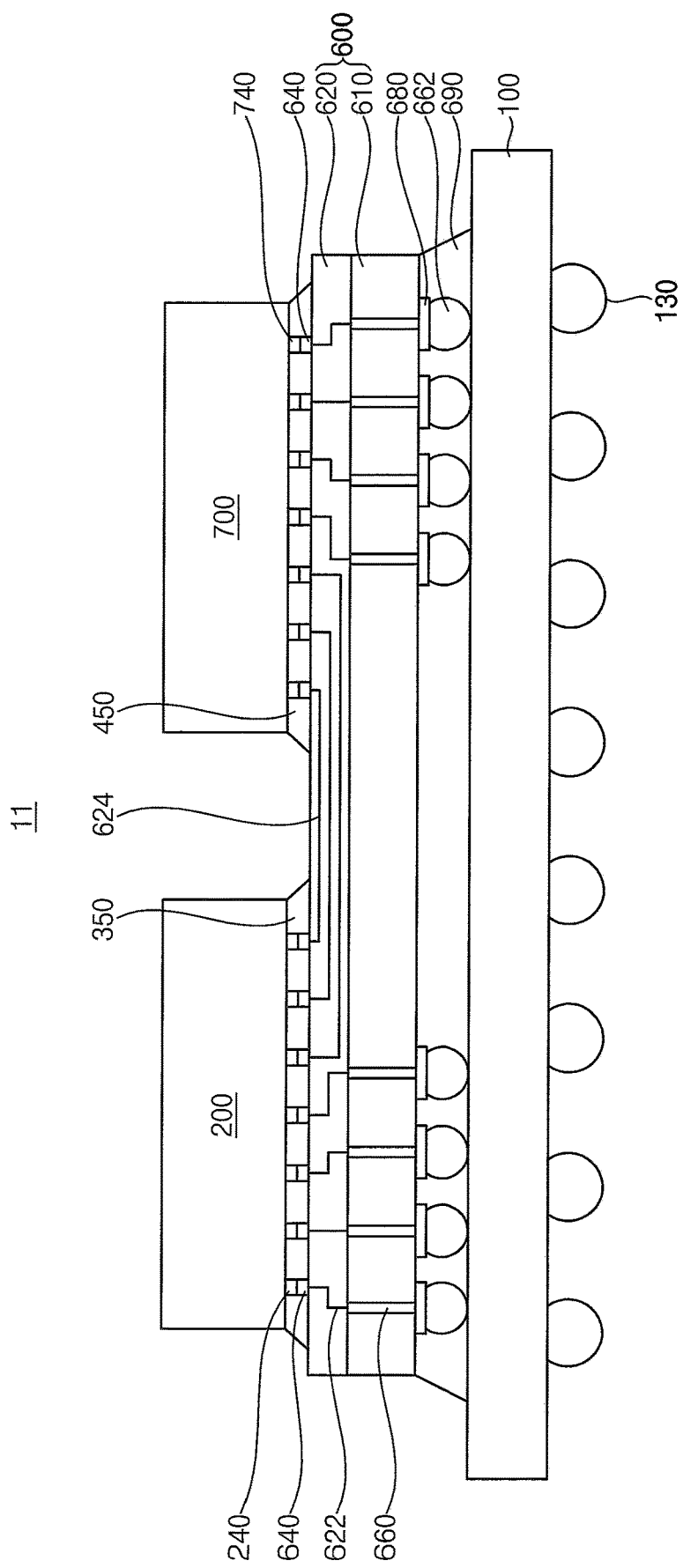
FIG. 37 is a cross-sectional view illustrating a semiconductor package in accordance with an exemplary embodiment of the present inventive concept.

FIG. 37 is a cross-sectional view illustrating a semiconductor package in accordance with an exemplary embodiment of the present inventive concept. The semiconductor package may be substantially the same as or similar to the semiconductor package described with reference to FIGS. 1 and 2 except that the semiconductor package has a 2.5D package configuration. Thus, the same reference numerals will be used to refer to the same or like elements and any further repetitive description concerning the above elements may be omitted.

Referring to FIG. 37, a semiconductor package 11 may include a package substrate 100, an interposer 600, a first semiconductor device 200 and a second semiconductor device 700.

In an exemplary embodiment of the present inventive concept, the semiconductor package 11 may include a memory device having a stacked chip structure in which a plurality of dies (chips) is stacked. For example, the semiconductor package 11 may include a semiconductor device with a 2.5D chip structure. In this case, the first semiconductor device 200 may include, for example, a logic semiconductor device, and the second semiconductor device 700 may include, for example, a memory device. The logic semiconductor device may include, for example, a central processing unit (CPU), a graphic processing unit (GPU), an application-specific integrated circuit (ASIC), or a system on chip (SOC). For example, the memory device may include a high bandwidth memory device.

In an exemplary embodiment of the present inventive concept, the package substrate 100 may have opposite lower and upper surfaces. For example, the package substrate 100 may be a printed circuit board (PCB). The PCB may be a multilayered circuit board including vias and various circuits therein.

The interposer 600 may be disposed on the package substrate 100. The interposer 600 may be mounted on the package substrate 100 by solder bumps 662. For example, a planar area of the interposer 600 may be less than a planar area of the package substrate 100. The interposer 600 may be disposed within the area of the package substrate 100 in a plan view.

The interposer 600 may be, for example, a silicon interposer including a plurality of connecting wiring lines therein. The first semiconductor device 200 and the second semiconductor device 700 may be connected to each other through the connecting wiring lines and/or may be electrically connected to the package substrate 100 through the solder bumps 662.

The silicon interposer may provide a high density interconnection between the first and second semiconductor devices 200 and 700.

For example, the interposer 600 may include a semiconductor substrate 610 and/or a wiring layer 620 including a plurality of wiring lines on the semiconductor substrate 610. For example, the plurality of wiring lines may be disposed on an upper surface of the semiconductor substrate 610. A plurality of the wiring lines may include first wiring lines 622 and/or second wiring lines 624. The semiconductor substrate 610 may include a plurality of through electrodes 660 passing therethrough. Each of the through electrodes 660 may include a through-silicon via (TSV).

In an exemplary embodiment of the present inventive concept, the first and second semiconductor devices 200 and 700 may be disposed on the interposer 600. The first and second semiconductor devices 200 and 700 may be mounted on the interposer 600 such that chip pads of the first and second semiconductor devices 200 and 700 face the interposer 600. The chip pads of the first and second semiconductor devices 200 and 700 may be electrically connected to pads of the interposer 600 by the conductive connector in FIG. 1.

For example, a second metal bump structure 240 of the first semiconductor device 200 and a first metal bump structure 640 of the interposer 600 may be bonded to each other to sever as an electrical connector for electrically connecting the first semiconductor device 200 and the interposer 600 to each other. For example, the first metal bump structure 640 and the second metal bump structure 240 may be at least partially surrounded by a first mold layer 350 (or, e.g., a fill layer).

A second metal bump structure 740 of the second semiconductor device 700 and a first metal bump structure 640 of the interposer 600 may be bonded to each other to sever as an electrical connector for electrically connecting the second semiconductor device 700 and the interposer 600 to each other. For example, the first metal bump structure 640 and the second metal bump structure 740 may be at least partially surrounded by a second mold layer 450 (or, e.g., a fill layer).

The interposer 600 may be mounted on the package substrate 100 through solder bumps 662. For example, the solder bump 662 may include C4 bump. A pad 680 of the interposer 600 may be electrically connected to a substrate pad of the package substrate 100 by the solder bump 662.

As mentioned above, the first and second semiconductor devices 200 and 700 of the semiconductor package 11 having a 2.5D chip structure may be electrically connected to the interposer 600 by the conductive connector in FIG. 1.

In addition, the semiconductor package 11 may be a semiconductor memory device having a 3D chip structure. In this case, the semiconductor package 11 may include a first semiconductor device 200 and a second semiconductor device 700 sequentially stacked on a package substrate 100. The first semiconductor device 200 and the second semiconductor device 700 may be electrically connected to each other by the conductive connector in FIG. 1.

In an exemplary embodiment of the present inventive concept, the semiconductor package 11 may be a fan-out stack package including sequentially stacked first and second semiconductor devices 200 and 700. In this case, the first semiconductor device 200 and the second semiconductor device 700 may be electrically connected to each other by the conductive connector in FIG. 1.

The semiconductor package 11 may include semiconductor devices such as logic devices or memory devices. The semiconductor package 11 may include logic devices such as central processing units (CPUs), main processing units (MPUs), or application processors (APs), or the like, and volatile memory devices such as dynamic random access memory (DRAM) devices, high bandwidth memory (HBM) devices, or non-volatile memory devices such as flash memory devices, parameter random access memory (PRAM) devices, magneto-resistive random-access memory (MRAM) devices, resistive random-access memory (ReRAM) devices, or the like.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor package, comprising:
a first semiconductor device including a first pad and a first metal bump structure provided on the first pad; and
a second semiconductor device stacked on the first semiconductor device, and including a third pad and a second metal bump structure provided on the third pad,
wherein the first metal bump structure and the second metal bump structure are bonded to each other to form a conductive connector that electrically connects the first and second semiconductor devices to each other,
wherein the first metal bump structure includes first, second and third metal patterns, wherein the second metal bump structure includes fourth, fifth and sixth metal patterns, wherein the first, second and third metal patterns of the first metal bump structure are stacked on the first pad, wherein the fourth, fifth and sixth metal patterns of the second metal bump structure are stacked on the third pad,
wherein each of the first metal pattern, the third metal pattern, the fourth metal pattern, and the sixth metal pattern include a first metal having a first coefficient of thermal expansion, and each of the second metal pattern and the fifth metal pattern includes a second metal having a second coefficient of thermal expansion greater than the first coefficient of thermal expansion,
wherein the second metal pattern has an annular shape covering a peripheral region of the first metal pattern, and the third metal pattern is provided on the first metal pattern to cover the second metal pattern, and wherein the fifth metal pattern has an annular shape covering a peripheral region of the fourth metal pattern, and the sixth metal pattern is provided on the fourth metal pattern to cover the fifth metal pattern.

2. The semiconductor package of claim 1, wherein the first metal includes copper (Cu).

3. The semiconductor package of claim 2, wherein the second metal includes at least one of zinc (Zn), aluminum (Al) or silver (Ag).

4. The semiconductor package of claim 1, wherein diameters of the first and second metal bump structures, respectively, are within a range of about 2 μm to about 15 μm.

5. The semiconductor package of claim 1, wherein the first metal pattern and the fourth meatal pattern have a first thickness, wherein the second metal pattern and the fifth metal pattern have a second thickness smaller than the first thickness, and wherein the third metal pattern and the sixth metal pattern have a third thickness smaller than the first thickness.

6. The semiconductor package of claim 5, wherein the first thickness is within a range of about 70% to about 85% of the whole thickness of each of the first and second metal bump structures, wherein the second thickness is within a range of about 10% to about 20% of the whole thickness of each of the first and second metal bump structures.

7. The semiconductor package of claim 1, wherein a first width of a first junction surface, which is formed between the first metal pattern and the second metal pattern, is less than a second width of a second junction surface, which is formed between the first metal pattern and the third metal pattern.

8. The semiconductor package of claim 7, wherein a third width of a third junction surface, which is formed between the fourth metal pattern and the fifth metal pattern, is less than a fourth width of a fourth junction surface, which is formed between the fourth metal pattern and the sixth metal pattern.

9. The semiconductor package of claim 8, wherein a fifth width of a fifth junction surface, which is formed between the third metal pattern and the sixth metal pattern, is greater than the second width and the fourth width.

10. The semiconductor package of claim 1, wherein an outer surface of the second metal pattern is exposed from the third metal pattern, wherein an outer surface of the fifth metal pattern is exposed from the sixth metal pattern.

11. A semiconductor package, comprising:
a first semiconductor device including a first pad and a first metal bump structure provided on the first pad; and
a second semiconductor device stacked on the first semiconductor device, and including a third pad and a second metal bump structure provided on the third pad,
wherein the first metal bump structure includes:
a first main pattern including copper (Cu), wherein the first main pattern of the first metal bump structure is provided on the first pad; and
a first sub pattern provided inside the first main pattern adjacent to a first junction surface and including a second metal having a coefficient of thermal expansion greater than that of copper (Cu),
wherein the second metal bump structure includes:
a second main pattern including copper (Cu), wherein the second main pattern of the second metal bump structure is provided on the third pad; and
a second sub pattern provided inside the second main pattern adjacent to the first junction surface and including the second metal having the coefficient of thermal expansion greater than that of copper (Cu),
wherein the first junction surface is formed by the bonding between a first surface of the first main pattern of the first metal bump structure and a first surface of the second main pattern of the second metal bump structure,
wherein the first main pattern has a cuboid shape or a cylindrical shape, the first sub pattern has an annular shape, and an outer surface of the first sub pattern is exposed from the first main pattern, and
wherein the second main pattern has a cuboid shape or a cylindrical shape, the second sub pattern has an annular shape, and an outer surface of the second sub pattern is exposed from the second main pattern.

12. The semiconductor package of claim 11, wherein the second metal includes at least one of zinc (Zn), aluminum (Al) or silver (Ag).

13. The semiconductor package of claim 11, wherein diameters of the first and second metal bump structures, respectively, are within a range of about 2 μm to about 15 μm.

14. The semiconductor package of claim 11, wherein a first width of the first junction surface is greater than a second width of a second junction surface, which is formed between the first main pattern and the first sub pattern.

15. The semiconductor package of claim 14, wherein a fourth width of a first portion of the first main pattern, which is surrounded by the first sub pattern, is greater than the second width.

16. The semiconductor package of claim 11, wherein a first width of the first junction surface is greater than a third width of a third junction surface, which is formed between the second main pattern and the second sub pattern.

17. The semiconductor package of claim 16, wherein a fifth width of a second portion of the second main pattern, which is surrounded by the second sub pattern, is greater than the third width.

18. A semiconductor package, comprising:
a package substrate;
a first semiconductor chip stacked on the package substrate, and including a first pad and a first metal bump structure provided on the first pad; and
a second semiconductor chip stacked on the first semiconductor chip, and including a third pad and a second metal bump structure provided on the third pad,
wherein the first and second metal bump structures are bonded to each other to form a conductive connector that electrically connects the first and second semiconductor chips to each other,
wherein the first metal bump structure includes first, second and third metal patterns, wherein the first, second and third metal patterns are stacked on the first pad,
wherein the second metal bump structure includes fourth, fifth and sixth metal patterns, wherein fourth, fifth and sixth metal patterns are stacked on the third pad,
wherein the first, third, fourth and sixth metal patterns include copper (Cu), and the second and fifth metal patterns include a metal having a coefficient of thermal expansion greater than that of copper (Cu),
wherein the second metal pattern has an annular shape covering a peripheral region of the first metal pattern, and the third metal pattern is provided on the first metal pattern to cover the second metal pattern,
wherein the fifth metal pattern has an annular shape covering a peripheral region of the fourth metal pattern, and the sixth metal pattern is provided on the fourth metal pattern to cover the fifth metal pattern, and wherein diameters of the first and second metal bump structures, respectively, are within a range of about 2 µm to about 15 µm.

19. The semiconductor package of claim 18, wherein the metal includes at least one of zinc (Zn), aluminum (Al) or silver (Ag).

20. The semiconductor package of claim 18, wherein the first metal pattern and the fourth metal pattern have a first thickness, wherein the second metal pattern and the fifth metal pattern have a second thickness smaller than the first thickness, and wherein the third metal pattern has a third thickness smaller than the first thickness.

\* \* \* \* \*